(12) United States Patent
Park et al.

(10) Patent No.: US 12,446,364 B2
(45) Date of Patent: Oct. 14, 2025

(54) NANOROD LED, DISPLAY APPARATUS INCLUDING THE SAME, AND METHOD OF MANUFACTURING THE NANOROD LED

(71) Applicant: SAMSUNG ELECTRONICS CO., LTD., Suwon-si (KR)

(72) Inventors: Younghwan Park, Seongnam-si (KR); Joosung Kim, Seongnam-si (KR); Dongchul Shin, Suwon-si (KR); Junhee Choi, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 380 days.

(21) Appl. No.: 17/967,318

(22) Filed: Oct. 17, 2022

(65) Prior Publication Data
US 2023/0238484 A1    Jul. 27, 2023

(30) Foreign Application Priority Data
Jan. 25, 2022 (KR) .................. 10-2022-0011026

(51) Int. Cl.
*H10H 20/819* (2025.01)
*B82Y 40/00* (2011.01)
*H10H 20/01* (2025.01)
*H10H 20/813* (2025.01)
*H10H 20/816* (2025.01)
(Continued)

(52) U.S. Cl.
CPC ...... *H10H 20/819* (2025.01); *H10H 20/0137* (2025.01); *H10H 20/8252* (2025.01); *H10H 20/8312* (2025.01); *H10H 29/142* (2025.01)

(58) Field of Classification Search
CPC ........... H10H 20/812; H10H 20/01335; H10H 20/825; H10H 20/819; H10H 20/8514; H10H 20/8252; H10H 20/816; H10H 20/813; H10H 20/818; H10H 20/821; H10H 20/013–0137; H10H 29/14–142; H01L 25/0753; G09F 9/33
See application file for complete search history.

(56) References Cited

U.S. PATENT DOCUMENTS 9,287,446 B2 *   3/2016   Yoo .................... B82Y 20/00
10,957,818 B2    3/2021   Ahmed
(Continued)

FOREIGN PATENT DOCUMENTS

DE    10 2010 012 711 A1    9/2011
JP            6486519 B2     3/2019
KR     1020200102615 A      9/2020

OTHER PUBLICATIONS

Mikulics et al., "Nano-light-emitting-diodes based on InGaN mesoscopic structures for energy saving optoelectronics", Applied Physics Letters, AIP Publishing, Jul. 26, 2016, (6 total pages).
(Continued)

*Primary Examiner* — Sonya McCall-Shepard
(74) *Attorney, Agent, or Firm* — Sughrue Mion, PLLC

(57) ABSTRACT

Provided are nanorod light emitting diodes (LEDs), display apparatuses, and manufacturing methods thereof. The nanorod LED includes a first-type semiconductor layer including a body and a pyramidal structure continuously provided from the body, a nitride light emitting layer provided on the pyramidal structure, and a second-type semiconductor layer provided in the nitride light emitting layer.

30 Claims, 24 Drawing Sheets

(51) Int. Cl.
*H10H 20/818* (2025.01)
*H10H 20/821* (2025.01)
*H10H 20/825* (2025.01)
*H10H 20/831* (2025.01)
*H10H 20/851* (2025.01)
*H10H 29/14* (2025.01)

(56) References Cited

U.S. PATENT DOCUMENTS

| | | | |
|---|---|---|---|
| 11,094,846 B1 | 8/2021 | Khalid et al. | |
| 11,749,708 B2 * | 9/2023 | Lee | H10H 20/857 257/79 |
| 2014/0166974 A1 * | 6/2014 | Yoo | H10H 20/813 257/13 |
| 2016/0087150 A1 | 3/2016 | Ristic et al. | |
| 2017/0301823 A1 | 10/2017 | Svensson et al. | |
| 2019/0341525 A1 | 11/2019 | Danesh et al. | |
| 2019/0355878 A1 | 11/2019 | Ahmed | |
| 2019/0371964 A1 | 12/2019 | Bour et al. | |
| 2022/0140186 A1 | 5/2022 | Min et al. | |
| 2022/0262978 A1 | 8/2022 | Munshi et al. | |

OTHER PUBLICATIONS

EP Communication dated Jun. 16, 0223 from the European Patent Office in EP Patent Application No. 22206590.6.

\* cited by examiner

NANOROD LED, DISPLAY APPARATUS INCLUDING THE SAME, AND METHOD OF MANUFACTURING THE NANOROD LED

CROSS-REFERENCE TO RELATED APPLICATION

This application is based on and claims priority under 35 U.S.C. § 119 to Korean Patent Application No. 10-2022-0011026, filed on Jan. 25, 2022, in the Korean Intellectual Property Office, the disclosure of which is incorporated by reference herein in its entirety.

BACKGROUND

1. Field

The disclosure relates to nanorod light emitting diodes (LEDs), display apparatuses, and manufacturing methods.

2. Description of the Related Art

Display apparatuses, such as, liquid crystal displays (LCDs), organic light emitting display apparatuses, LED displays, and the like have been widely used. Display apparatuses with increased resolution have been developed and high resolution thereof is implemented by reducing a pixel size. However, configuring pixels with LEDs increases the manufacturing costs, and thus, nanorod LEDs have been included in pixels in order to lower the manufacturing costs. In addition, if all RGB colors for realizing a display apparatus are implemented with LEDs, colors may be implemented without a color filter, and thus, interest in nanorod LEDs has further increased.

SUMMARY

Provided are nanorod light emitting diodes (LEDs) configured to reduce a change in wavelength caused by current injection.

Provided are display apparatuses having improved color reproducibility by reducing a change in wavelength caused by current injection.

Provided are methods of manufacturing a nanorod LED having a pyramidal structure.

Additional aspects will be set forth in part in the description which follows and, in part, will be apparent from the description, or may be learned by practice of the presented embodiments of the disclosure.

According to an aspect of the disclosure, there is provided a nanorod light emitting diode (LED) including: a first-type semiconductor layer including a body and a pyramidal structure continuously provided from the body, a nitride light emitting layer provided on the pyramidal structure and a second-type semiconductor layer provided on the nitride light emitting layer, wherein the first-type semiconductor layer, the nitride light emitting layer, and the second-type semiconductor layer are stacked to form a nanorod, and wherein the nanorod has a diameter in a direction, in which, the first-type semiconductor layer, the nitride light emitting layer, and the second-type semiconductor layer are stacked.

The diameter may range from about 0.1 μm to about 1 μm.

A thickness of the nanorod may be greater than the diameter.

A maximum thickness of the second-type semiconductor layer may be in a range between 20 nm to 2 μm.

The first-type semiconductor layer and the second-type semiconductor layer may include $Al_{x1}In_{y1}Ga_{1-x1-y1}N$ ($0 \leq x1 \leq 1$, $0 \leq y1 \leq 1$, $0 \leq (x1+y1) \leq 1$).

The nitride light emitting layer may include $Al_{x2}In_{y2}Ga_{1-x2-y2}N$ ($0.1 \leq (x2+y2) \leq 1$, $0.1 < y2 < 0.6$).

The first-type semiconductor layer may include a dopant including Si, Ge, and Sn.

The second-type semiconductor layer may include Mg and B.

The pyramidal structure may include a hexagonal pyramidal structure or a truncated hexagonal pyramidal structure.

An entire upper surface of the second-type semiconductor layer may be positioned to be higher than a maximum height of the nitride light emitting layer.

An upper surface of the second-type semiconductor layer may be configured to have a planar or concave-convex structure.

The nanorod may be configured to have a circular cross-section or a hexagonal cross-section.

The pyramidal structure may be provided in plurality.

The nanorod LED may further include an insulating layer directly between a portion of the nitride light emitting layer and a portion of the body of the first-type semiconductor layer.

The nanorod LED may further include a protective layer on a side surface of the nanorod.

According to another aspect of the disclosure, there is provided a display apparatus including: a substrate, a common electrode provided on a first side of an upper surface of the substrate, a plurality of pixel electrodes provided to face the common electrode and spaced apart from each other and a nanorod light emitting diode (LED) connected between the common electrode and the plurality of pixel electrodes, wherein the nanorod LED includes: a first-type semiconductor layer including a body and a pyramidal structure continuously provided from the body, a nitride light emitting layer provided in the pyramidal structure and a second-type semiconductor layer provided on the nitride light emitting layer, wherein the first-type semiconductor layer, the nitride light emitting layer, and the second-type semiconductor layer are stacked to form a nanorod, and wherein the nanorod has a diameter in a direction, in which, the first-type semiconductor layer, the nitride light emitting layer, and the second-type semiconductor layer are stacked.

According to another aspect of the disclosure, there is provided a method of manufacturing a nanorod light emitting diode (LED), the method including: providing a first-type semiconductor layer on a substrate, providing a mask on the first-type semiconductor layer and forming a growth pattern structure on the mask, forming a pyramidal structure by growing the first-type semiconductor layer based on the growth pattern structure, forming a nitride light emitting layer on the pyramidal structure, forming a second-type semiconductor layer on the nitride light emitting layer, etching the second-type semiconductor layer, the nitride light emitting layer and the first-type semiconductor layer to form a separation hole extending from the second-type semiconductor layer to a lower portion of the first-type semiconductor layer and separating the first-type semiconductor layer, the nitride light emitting layer, and the second-type semiconductor layer based on the separation hole to form a nanorod, wherein the nanorod has a same diameter in a direction, in which, the first-type semiconductor layer, the nitride light emitting layer, and the second-type semiconductor layer are stacked.

According to another aspect of the disclosure, there is provided a nanorod including: a first-type semiconductor layer including a body portion and a top portion provided on the body portion, the top portion having a structure configured to expose one or more semi-polar planes, a nitride light emitting layer provided on the top portion of the first-type semiconductor layer and a second-type semiconductor layer provided on the nitride light emitting layer.

The first-type semiconductor layer, the nitride light emitting layer, and the second-type semiconductor layer may be stacked to form the nanorod, and the nanorod may have a same diameter in a direction, in which, the first-type semiconductor layer, the nitride light emitting layer, and the second-type semiconductor layer are stacked.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
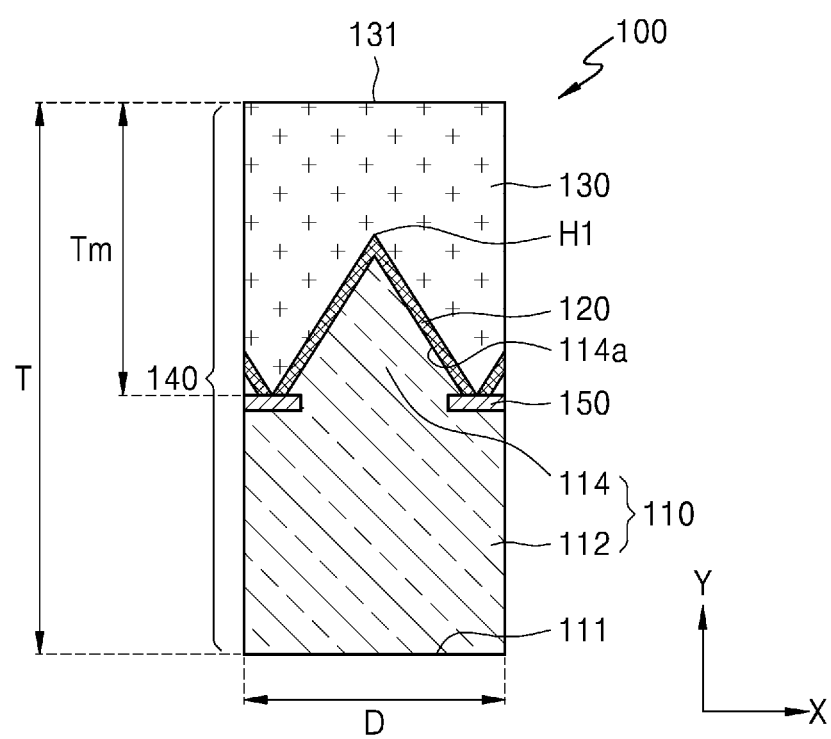
FIG. 1 is a schematic cross-sectional view of a nanorod light emitting diode (LED) according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a nanorod LED, a display apparatus, and a method of manufacturing the same according to various example embodiments will be described in detail with reference to the accompanying drawings. In the following drawings, like reference numerals refer to like components, and the size of each component in the drawings may be exaggerated for clarity and convenience of description. Terms such as first, second, etc. may be used to describe various elements, but the elements should not be limited by the terms. The terms are used only for the purpose of distinguishing one component from another.

The singular expressions include plural expressions unless the context clearly dictates otherwise. When a portion "includes" a component, it may indicate that the portion does not exclude another component but may further include another component, unless otherwise stated. In addition, in the drawings, the size or thickness of each component may be exaggerated for clarity of description. Further, when it is described that a predetermined material layer is present on a substrate or another layer, the material layer may exist in direct contact with the substrate or another layer, or another third layer may exist therebetween. In addition, because the materials constituting each layer in the following embodiments are examples, other materials may be used.

In addition, the term, such as " . . . unit" or "module," disclosed in the specification indicates a unit for processing at least one function or operation, and this may be implemented by hardware, software, or a combination thereof.

The specific implementations described in the example embodiment do not limit the technical scope in any way. For brevity of the specification, descriptions of conventional electronic components, control systems, software, and other functional aspects of the systems may be omitted. In addition, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of the terms "a" and "an" and "the" and similar referents may cover both the singular and the plural.

The operations or steps constituting a method may be performed in any suitable order unless there is a clear statement that the operations or steps in the method should be performed in the order described. In addition, the use of all exemplary terms (e.g., etc.) is merely for describing technical ideas in detail, and the scope of the disclosure is not limited by these terms unless limited by claims.

FIG. 1 illustrates a nanorod light emitting diode (LED) 100 according to an example embodiment.

Figure 2A:
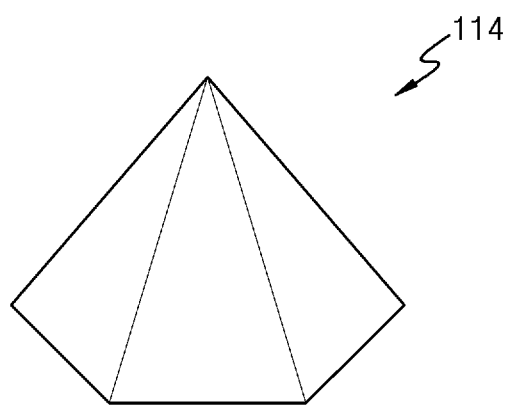
FIGS. 2A and 2B illustrate examples of a pyramidal structure of a nanorod LED according to an example embodiment.
Figure 2B:
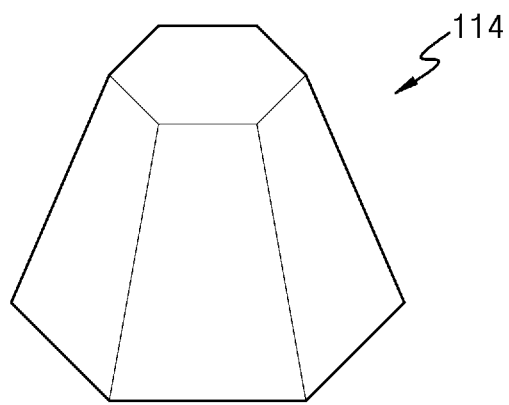

The nanorod LED 100 includes a first-type semiconductor layer 110, a nitride light emitting layer 120 provided on the first-type semiconductor layer 110, and a second-type semiconductor layer 130 provided on the nitride light emitting layer 120. The first-type semiconductor layer 110 may include a body 112 and a pyramidal structure 114 continuously provided from the body 110. The body 112 may have a structure having the same diameter in the entirety, and the pyramidal structure 114 may have a structure in which the diameter is changed. That is, diameter of the entire body 112 may be same, while the diameter of the pyramidal structure may decrease at a position moving away from the body 112. The body 112 and the pyramidal structure 114 may be integrally provided with the same material. Referring to FIGS. 2A and 2B, the pyramidal structure 114 may have, for example, a hexagonal pyramidal structure or a truncated hexagonal pyramidal structure. However, the pyramidal structure 114 is not limited thereto.

The first-type semiconductor layer 110 may include a group Ill-V n-type semiconductor, for example, an n-type nitride semiconductor. The first-type semiconductor layer 110 may include, for example, $Al_{x1}In_{y1}Ga_{1-x1-y1}N$ (0≤x1≤1, 0≤1≤1, 0≤(x1+y1)≤1). The first-type semiconductor layer 110 may include GaN, InN, AlN, or a combination thereof, and for example, the first-type semiconductor layer 110 may include n-GaN. The first-type semiconductor layer 110 may have a single-layer or multi-layer structure. The first-type semiconductor layer 110 may include a first-type dopant. The first-type semiconductor layer 110 may include an n-type dopant, and may include, for example, Si, Ge, Sn, or the like.

The nitride light emitting layer 120 may be provided in the pyramidal structure 114 of the first-type semiconductor layer 110. The pyramidal structure 114 may include a semi-polar plane 114a, and the nitride light emitting layer 120 may be provided on the semi-polar plane 114a to reduce a variation in wavelength according to the amount of current. The semi-polar plane 114a has a relatively small piezoelectric field, compared to a polar plane, and thus, a variation in wavelength according to the amount of current at a long wavelength may be reduced. For example, the semi-polar plane 114a may have a smaller piezoelectric field than a polar plane, and thus, a variation in wavelength according to the amount of current at a long wavelength may be reduced. The long wavelength may refer to, for example, a wavelength of 600 nm or higher. The polar plane may indicate a direction perpendicular to the stacking direction (a Y direction) of the nanorod 140, and the semi-polar plane 114a may indicate a surface having an inclination less than 90 degrees with respect to the stacking direction (the Y direction) of the nanorod 140. The semi-polar plane 114a may have, for example, an inclination of approximately 45 degrees with respect to the stacking direction (the Y direction).

Light may be generated as electrons and holes are combined in the nitride light emitting layer 120. The nitride light emitting layer 120 may have a multi-quantum well (MQW) or a single-quantum well (SQW) structure. The nitride light emitting layer 120 may include a group Ill-V semiconductor. The nitride light emitting layer 120 may include $Al_{x2}In_{y2}Ga_{1-x2-y2}N$ (0.1≤(x2+y2)≤1, 0.1<y2<0.6), and may include, for example, GaN.

The second-type semiconductor layer 130 may be provided on an upper surface of the nitride light emitting layer 120. The second-type semiconductor layer 130 may include, for example, a p-type semiconductor. The second-type semiconductor layer 130 may include a group Ill-V p-type semiconductor, for example, $Al_{x1}In_{y1}Ga_{1-x1-y1}N$ (0≤x1≤1, 0≤y1≤1, 0≤(x1+y1)≤1), for example, p-GaN. The second-type semiconductor layer 130 may have a single-layer or multi-layer structure. An upper surface 131 of the second-type semiconductor layer 130 may have a planar or concave-convex structure. FIG. 1 illustrates an example in which the upper surface 131 of the second-type semiconductor layer 130 is flat. The entire upper surface 131 of the second-type semiconductor layer 130 may be positioned higher than the highest point H1 of the nitride light emitting layer 120. The highest point H1 of the nitride light emitting layer 120 may be defined based on a height from a lower surface 111 of the first-type semiconductor layer 110. A maximum thickness Tm of the second-type semiconductor layer 130 may be in the range of 20 nm to 2 μm. The maximum thickness Tm may be defined as a maximum thickness from the upper surface 131 of the second-type semiconductor layer 130. A thickness of the second-type semiconductor layer 130 may not be uniform and may be configured to be different depending on a position.

The nanorod 140 in which the first-type semiconductor layer 110, the nitride light emitting layer 120, and the second-type semiconductor layer 130 are stacked may be configured to have the same diameter D in the stacking direction (the Y direction). Accordingly, the nanorod 140 may be provided in a rod shape. The diameter D may be in the range of 0.1 to 1 μm. A thickness T of the nanorod 140 may be greater than the diameter D.

An insulating layer 150 may be provided at a portion in which the nitride light emitting layer 120 meets the body 112 of the first-type semiconductor layer 110. The insulating layer 150 may serve as a mask with which the pyramidal structure 114 may be grown from the body 112. Accordingly, the insulating layer 150 may be provided at a boundary between the body 112 and the pyramidal structure 114.

Figure 3:
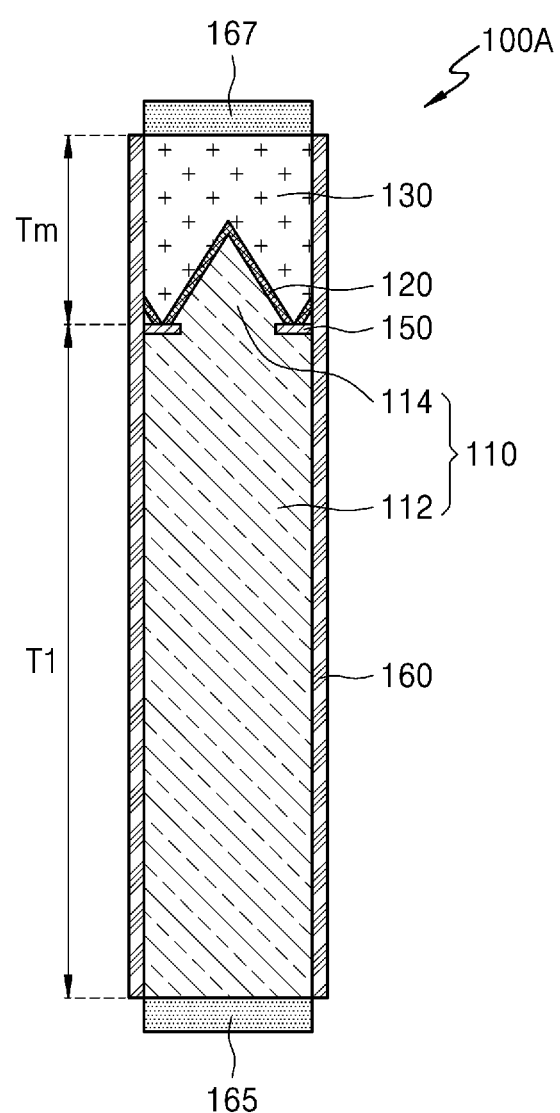
FIG. 3 is a view illustrating an example in which a protective layer is further provided in the nanorod LED of FIG. 1.

FIG. 3 illustrates an example in which a protective layer 160 is further provided in the nanorod LED of FIG. 1. In FIG. 3, components using the same reference numerals as those of FIG. 1 have substantially the same functions and operations, and thus, detailed descriptions thereof are omitted herein. A nanorod LED 100A may further include a protective layer 160 provided on a side surface of the nanorod 140 in which the first-type semiconductor layer 110, the nitride light emitting layer 120, and the second-type semiconductor layer 130 are stacked. The protective layer 160 may protect the nanorod 140 from an external environment, thereby increasing reliability of quality. The protective layer 160 may include, for example, $AL_2O_3$, $SiO_2$, or SiN.

A first electrode 165 may be provided on one surface of the first-type semiconductor layer 110, and a second electrode 167 may be provided on one surface of the second-type semiconductor layer 130. Light efficiency may be controlled by adjusting a ratio of a thickness T1 of the body 112 of the first-type semiconductor layer 110 to a maximum thickness Tm of the second-type semiconductor layer 130.

Figure 4:
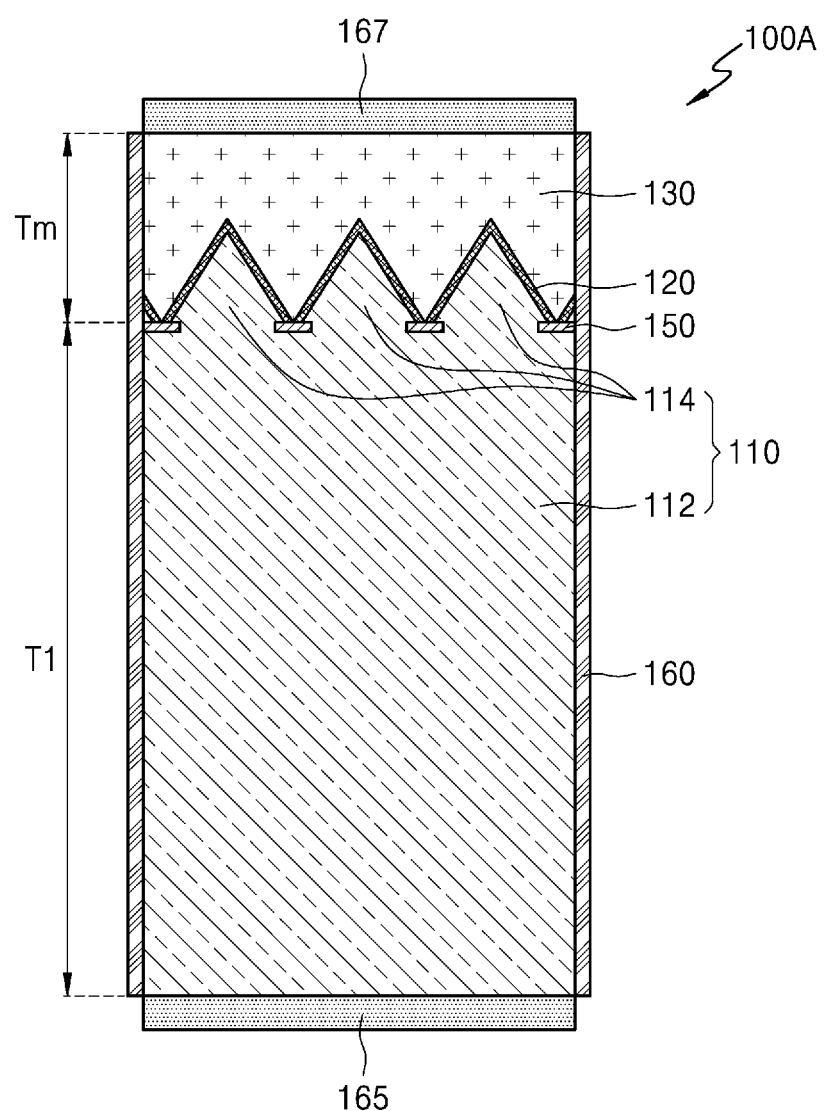
FIG. 4 illustrates a nanorod LED according to another example embodiment.

FIG. 4 illustrates an example embodiment in which a plurality of pyramidal structures 114 are provided. In FIG. 4, components using the same reference numerals as those of FIGS. 1 and 3 have substantially the same functions and operations, and thus, detailed descriptions thereof are omitted herein. By adjusting the number of the pyramidal structures 114, the light emission efficiency may be controlled and a variation in an emission wavelength according to the amount of current applied to the nanorod LED may be reduced.

Figure 5:
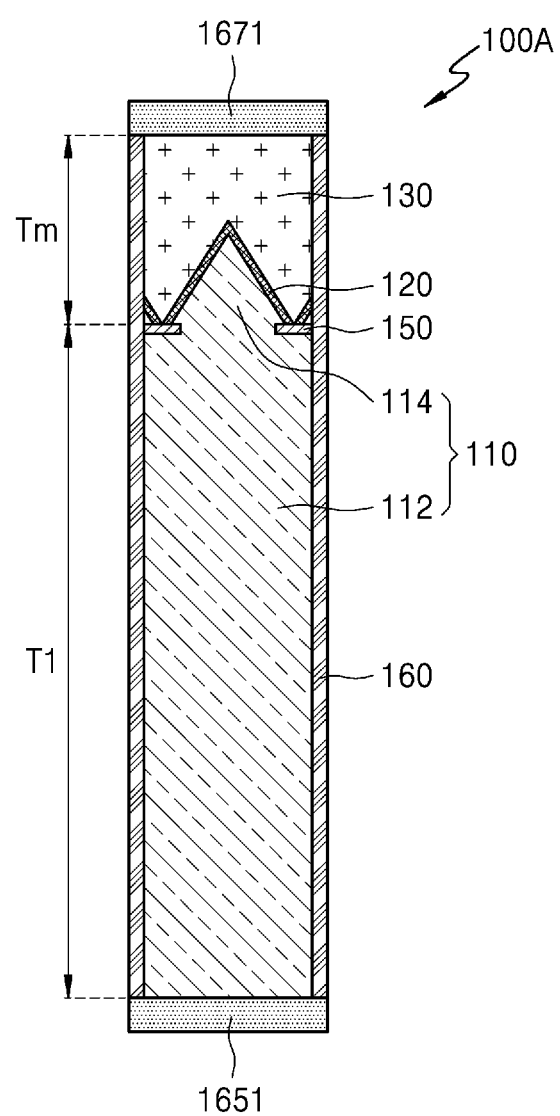
FIGS. 5 and 6 illustrate an example in which a position of an electrode is changed in the nanorod LED of FIG. 3.
Figure 6:
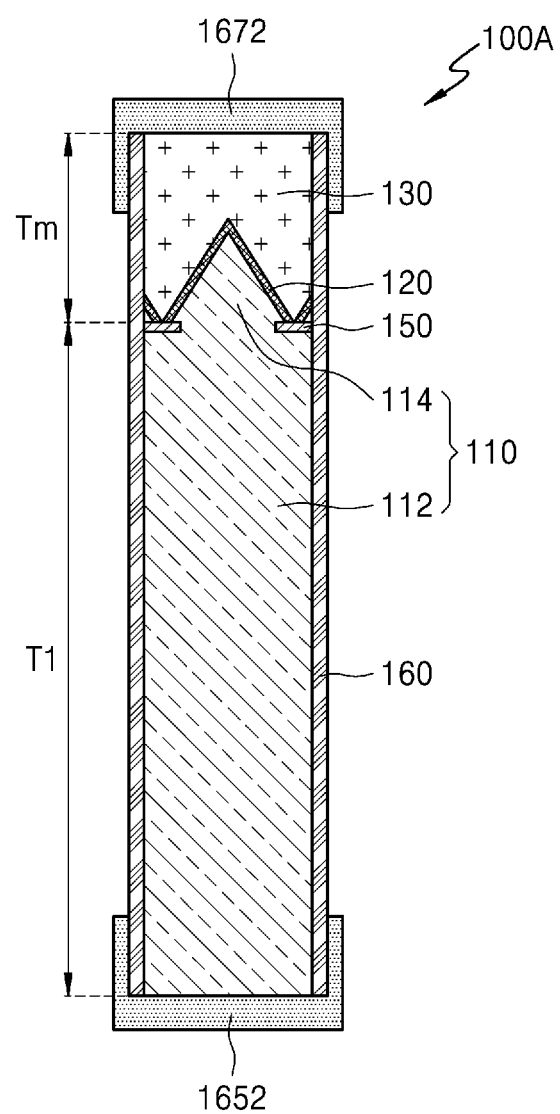

FIGS. 5 and 6 illustrate an example in which positions of electrodes are changed according to an example embodiment. Referring to FIG. 5, a first electrode 1651 may be provided to be in contact with both the first-type semiconductor layer 110 and the protective layer 160, and a second electrode 1671 may be provided to be in contact with both the second-type semiconductor layer 130 and the protective layer 160. Here, the arrangement of the first electrode 1651 and the second electrode 1671 in FIG. 5 are different from the arrangement of the first electrode 165 and the second electrode 167 in FIG. 3, in that the first electrode 165 and the second electrode 167 are not provided on the protective layer 160. Referring to FIG. 6, a first electrode 1652 may be provided to surround one surface of the first-type semiconductor layer 110 and a portion of the protective layer 160, and a second electrode 1672 may be provided to surround the second-type semiconductor layer 130 and a portion of the protective layer 160. As described above, the amount of current may be increased by increasing the areas of the first electrode 1652 and the second electrode 1672.

Figure 7:
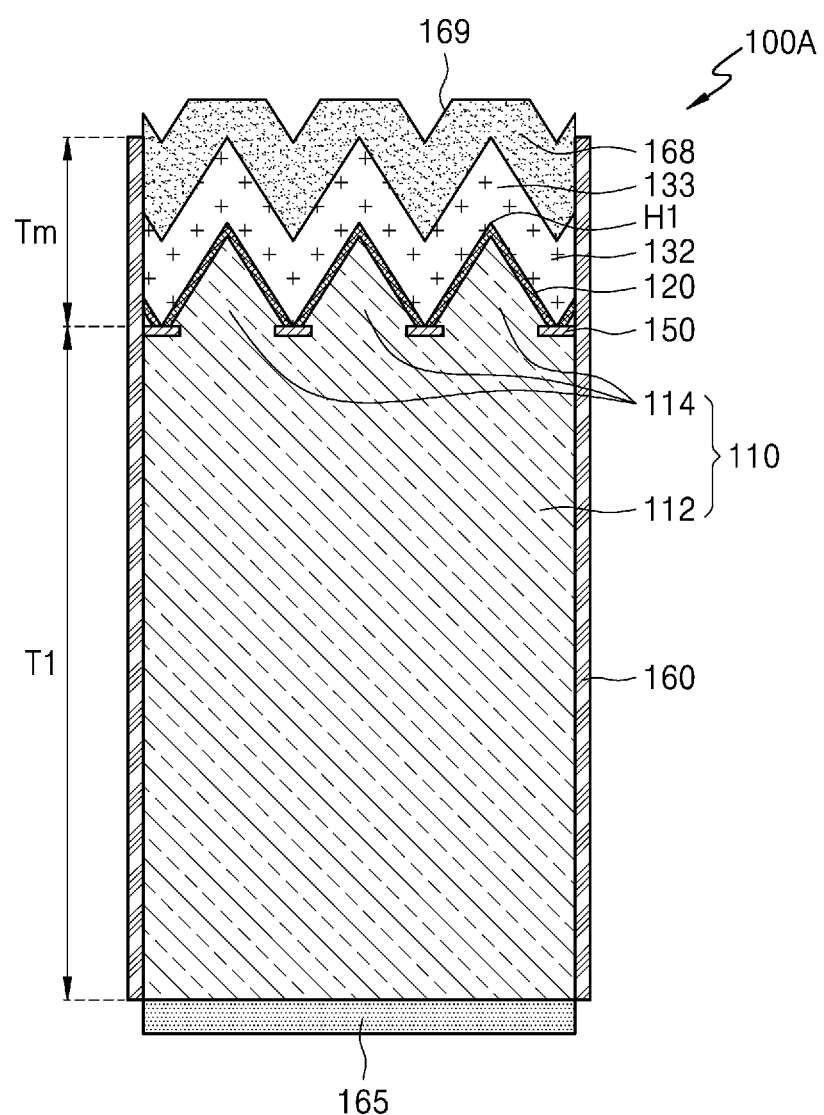
FIG. 7 illustrates an example in which a structure of a surface of an electrode is changed in the nanorod LED of FIG. 4.

FIG. 7 illustrates an example in which the second-type semiconductor layer is modified in the nanorod LED of FIG. 4 according to an example embodiment. The second-type semiconductor layer 132 may have a concave-convex structure 133. Light extraction efficiency may be improved due to a texturing effect of the concave-convex structure 133 of the second-type semiconductor layer 132. According to an example embodiment, the concave-convex structure 133 may be a pyramidal structure corresponding to the pyramidal structure 114 of the first-type semiconductor layer 110.

Figure 8:
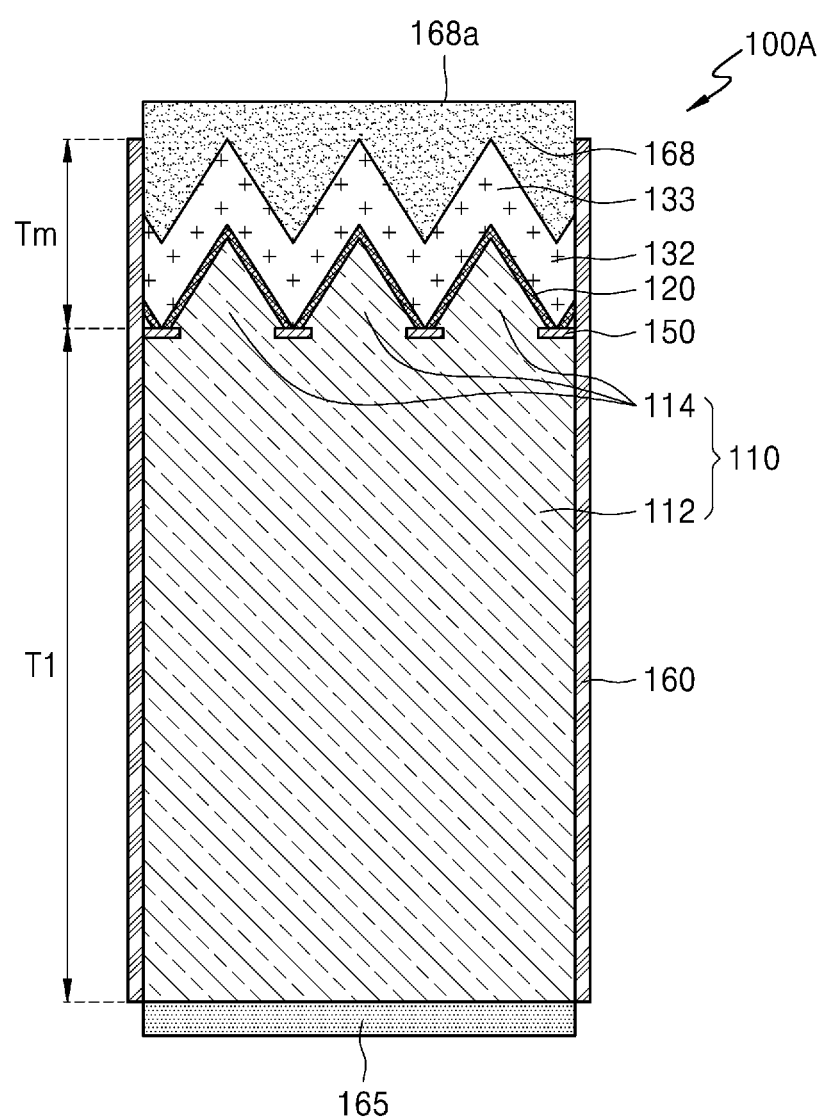
FIG. 8 illustrates an example in which a second-type semiconductor layer is changed in FIG. 5.

The concave-convex structure 133 of the second-type semiconductor layer 132 may be positioned higher than the highest point H1 of the nitride light emitting layer 120. Alternatively, in some cases, the concave-convex structure 133 of the second-type semiconductor layer 132 may be mixedly located at positions higher and lower than the highest point H1 of the nitride light emitting layer 120. The second electrode 168 may have a concave-convex structure 169 on an upper surface thereof. FIG. 8 illustrates an example embodiment, in which, an upper surface 168a of the second electrode 168 is configured as a flat surface, which is different from the nanorod LED of FIG. 7. In this manner, the configuration of the upper surface of the second electrode 168 may be varied.

Figure 9:
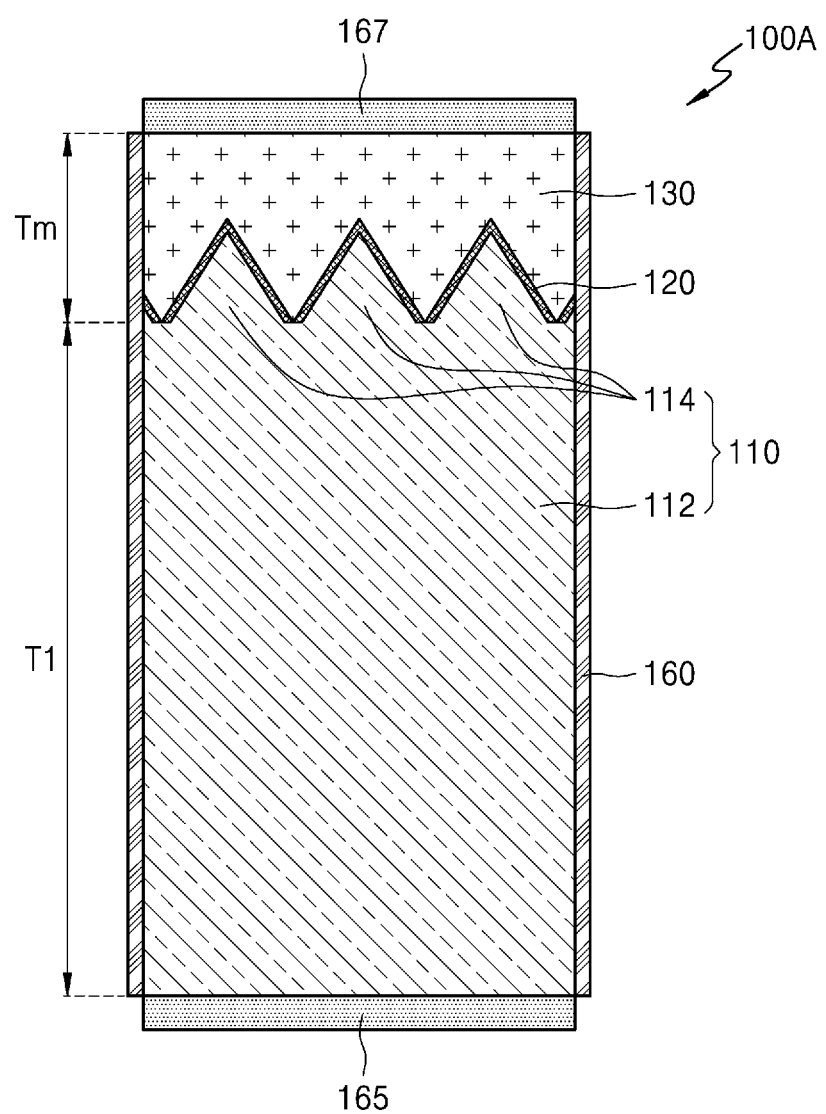
FIG. 9 illustrates a nanorod LED according to another example embodiment.

FIG. 9 illustrates an example embodiment in which an insulating layer 150 is removed from the nanorod LED of FIG. 4. As such, the entire surface of the nitride light emitting layer 120 may be configured to be in direct contact with the body 112 and the pyramidal structure 114 of the first-type semiconductor layer 110.

Figure 10:
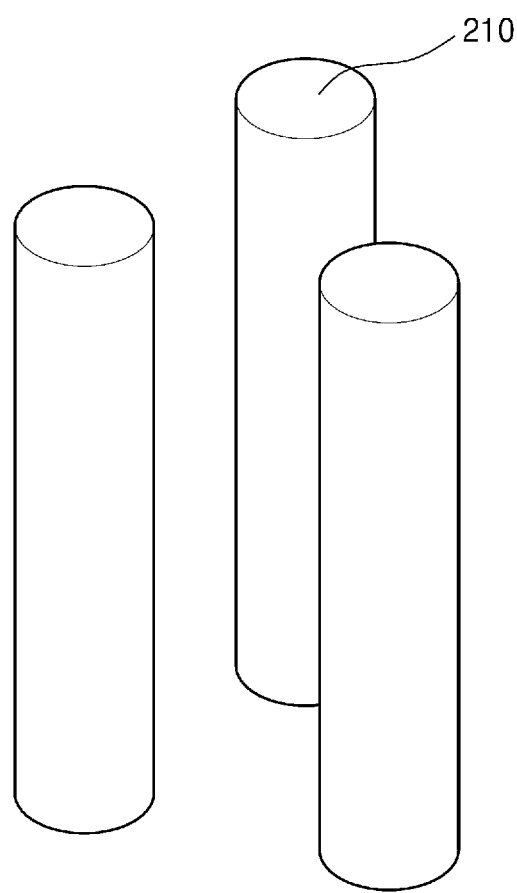
FIG. 10 illustrates an example in which a nanorod LED according to an example embodiment has a cylindrical structure.
Figure 11:
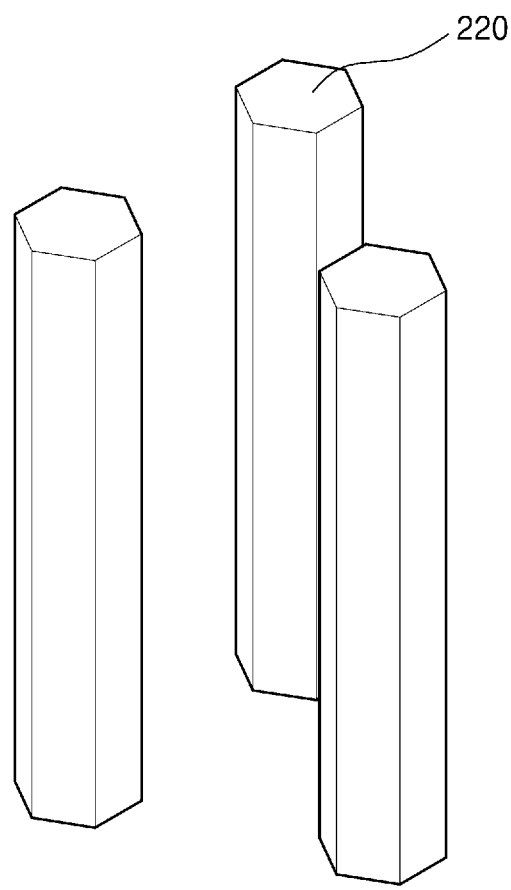
FIG. 11 illustrates an example in which a nanorod LED according to an example embodiment has a hexagonal pillar structure.

FIG. 10 illustrates a case in which a nanorod LED 210 has a cylindrical structure according to an example embodiment. The nanorod LED 210 may have a circular cross-sectional shape. FIG. 11 illustrates a case in which a nanorod LED 220 has a hexagonal pillar structure.

Figure 12:
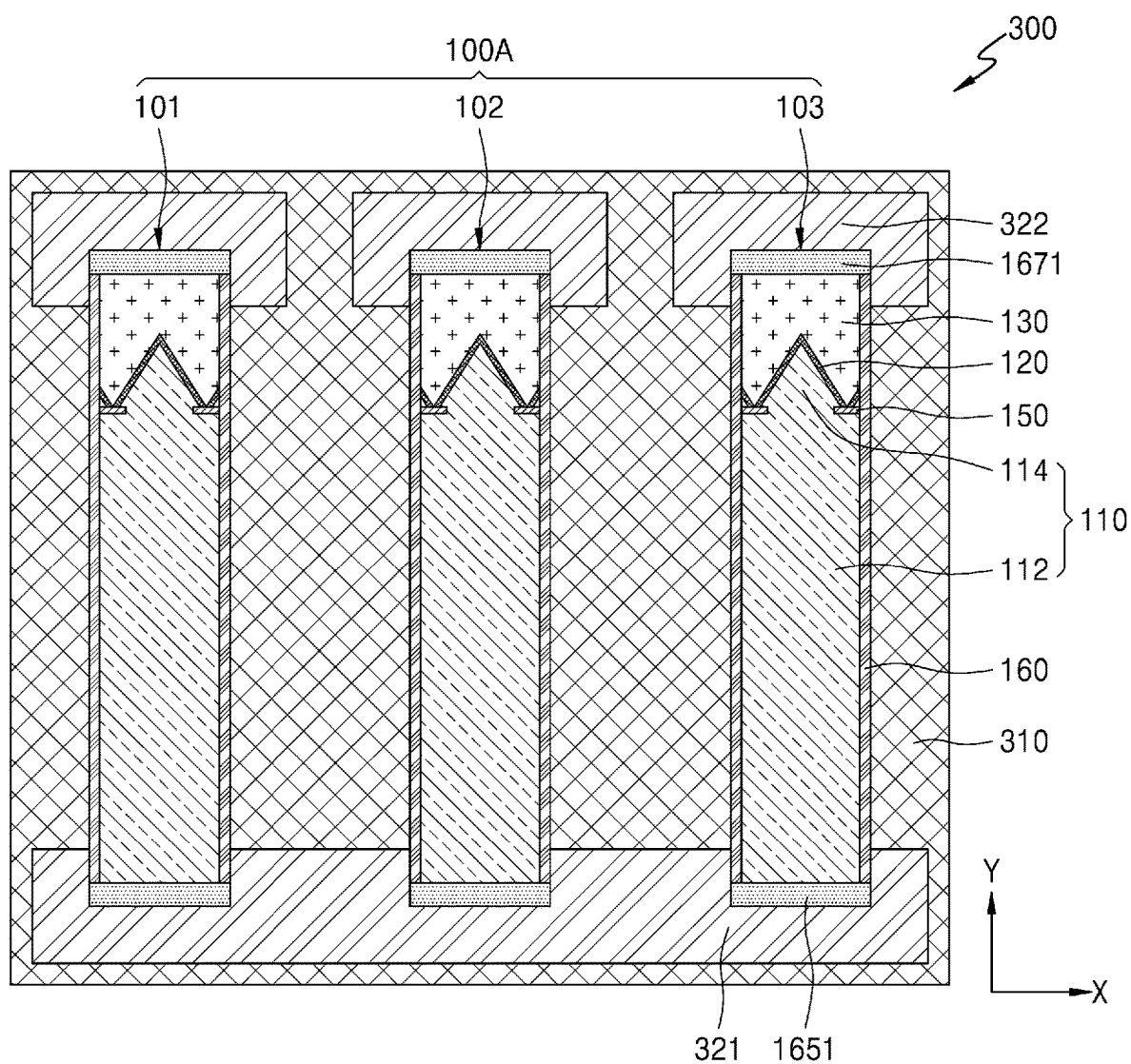
FIG. 12 illustrates a display apparatus according to an example embodiment.

FIG. 12 illustrates a display apparatus according to an example embodiment. In FIG. 12, components using the same reference numerals as those of FIGS. 1 and 5 have substantially the same functions and operations, and thus, detailed descriptions thereof are omitted herein.

The display apparatus 300 may include a substrate 310, a common electrode 321 provided on one side of an upper surface of the substrate, pixel electrodes 322 provided to face the common electrode 321, and nanorod LEDs 100A connected between the common electrode and the pixel electrodes 322. The pixel electrodes 322 may be spaced apart from each other. FIG. 12 illustrates one pixel of the display apparatus 300 according to an example embodiment. The nanorod LEDs 100A may include a first nanorod LED 101, a second nanorod LED 102, and a third nanorod LED 103. The nanorod LEDs 100A are substantially the same as that described above with reference to FIG. 3, and thus, a detailed description thereof is omitted.

For example, the first nanorod LED 101 may emit red light, the second nanorod LED 102 may emit green light, and the third nanorod LED 103 may emit blue light. A wavelength of light emitted from the nanorod LED 100A may vary depending on a material composition of the nitride light emitting layer 120.

The nanorod LED 100A may be provided such that a stacking direction (the Y direction) of each layer of the nanorod LED 100A is parallel to the substrate 310. A first electrode 1651 may be connected to the common electrode 321, and a second electrode 1671 may be connected to the pixel electrode 322.

Figure 13:
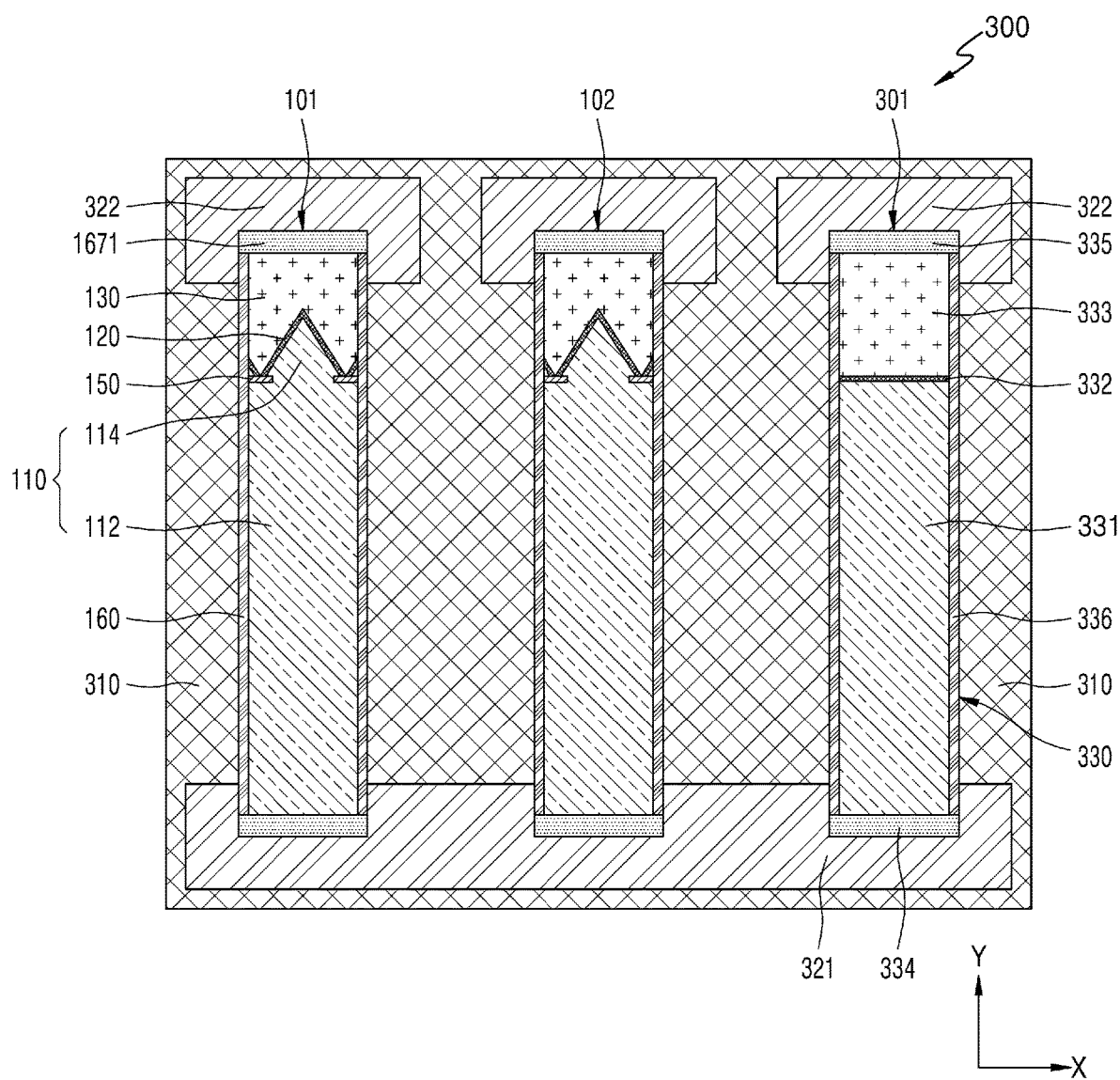
FIG. 13 illustrates an example in which a nanorod LED is changed in the display apparatus of FIG. 12.

FIG. 13 illustrates an example of a third nanorod LED 301 modified in the display apparatus shown in FIG. 12. In FIG. 13, components using the same reference numerals as those of FIG. 12 have substantially the same functions and operations, and thus, detailed descriptions thereof are omitted herein.

Referring to FIG. 13, a first nanorod LED 101 and a second nanorod LED 102 may include a pyramidal structure 114 in the first-type semiconductor layer 110, and a third nanorod LED 301 may not include a pyramidal structure. The first nanorod LED 101 may emit red light, the second nanorod LED 102 may emit green light, and the third nanorod LED 301 may emit blue light. With the pyramidal structure, a variation due to an increase in the amount of current with respect to light having a long wavelength band may be reduced. In the case of blue light, a variation according to the increase in the amount of current is relatively small, compared to that of red light or green light, and thus, the third nanorod LED 301 for blue light may have a nitride light emitting layer 332 provided on a polar plane without a pyramidal structure. The third nanorod LED 301 may include a first-type semiconductor layer 331, a nitride light emitting layer 332 provided on the first-type semiconductor layer 331, and a second-type semiconductor layer 333 provided on the nitride light emitting layer 332. The first-type semiconductor layer 331 may include a plane without a pyramidal structure, and the nitride light emitting layer 332 may be provided on the plane. A protective layer 336 may be provided on side surfaces of the first-type semiconductor layer 331, the nitride light emitting layer 332, and the second-type semiconductor layer 333, and a first electrode may be provided on one surface of the first-type semiconductor layer 331, and a second electrode 335 may be provided on the other surface of the second-type semiconductor layer 333.

Figure 14:
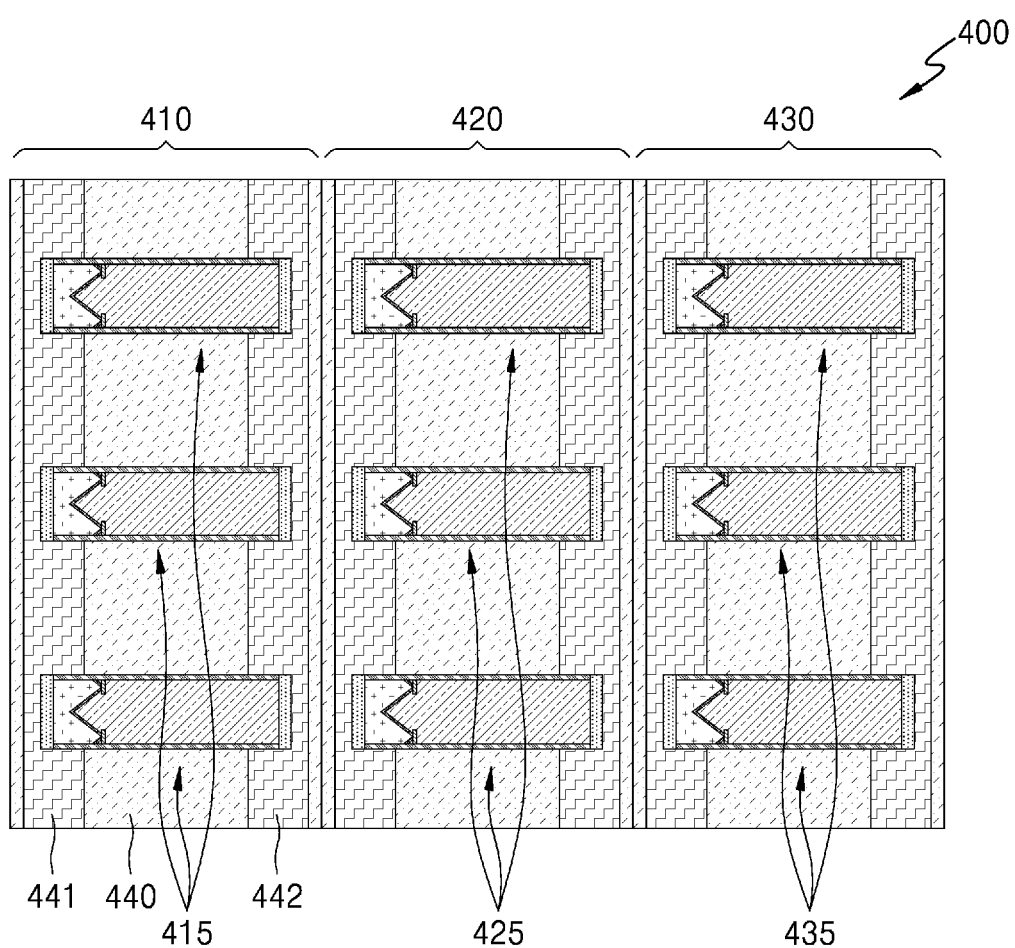
FIG. 14 is a view illustrating a display apparatus according to another example embodiment.

FIG. 14 illustrates a display apparatus 400 according to another example embodiment.

The display apparatus 400 may include a first sub-pixel 410, a second sub-pixel 420, and a third sub-pixel 430. The first sub-pixel 410 may include a plurality of first nanorod LEDs 415, the second sub-pixel 420 may include a plurality of second nanorod LEDs 425, and the third sub-pixel 430 may include a plurality of third nanorod LEDs 435. The first nanorod LED 415 may emit red light, the second nanorod LED 425 may emit green light, and the third nanorod LED 435 may emit blue light. In the example embodiment, a plurality of nanorod LEDs may be provided in each sub-pixel to increase the luminance of the display apparatus.

A first electrode 441 and a second electrode 442 may be arranged in parallel in each of the first sub-pixel 410, the second sub-pixel 420, and the third sub-pixel 430 on the substrate 440. Also, in the first sub-pixel 410, a plurality of first nanorod LEDs 415 may be arranged to be apart from each other in parallel between the first electrode 441 and the second electrode 442. In the second sub-pixel 420, a plurality of second nanorod LEDs 425 may be arranged to be apart from each other in parallel between the first electrode 441 and the second electrode 442. In the third sub-pixel 430, a plurality of third nanorod LEDs 435 may be arranged to be apart from each other in parallel between the first electrode 441 and the second electrode 442.

Next, in FIGS. 15-26, a method of manufacturing a nanorod LED according to an example embodiment is described.

Figure 15:
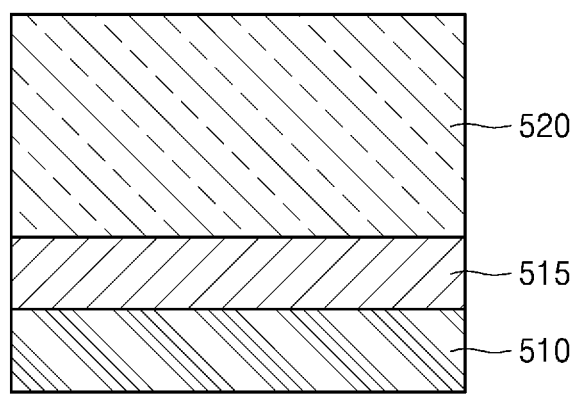
FIGS. 15 to 26 are diagrams illustrating a method of manufacturing a nanorod LED according to an example embodiment.

Referring to FIG. 15, a buffer layer 515 may be deposited on a substrate 510, and a first-type semiconductor layer 520 may be deposited on the buffer layer 515. The substrate 510 may include, for example, a sapphire substrate, a silicon substrate, a SiC substrate, a GaN substrate, or the like. The buffer layer 515 may be provided to help the growth of the first-type semiconductor layer 520. The buffer layer 515 may be configured to have various compositions and thicknesses to alleviate lattice mismatch between the first-type semiconductor layer 520 and the substrate 510, prevent meltback, reduce defects, and control warpage. For example, the buffer layer 515 may include AlxGa(1−x)N (0≤x≤1). However, the buffer layer 515 may be omitted depending on the substrate 510. The first-type semiconductor layer 520 may include $Al_{x1}In_{y1}Ga_{1-x1-y1}N$ (0≤x1≤1, 0≤y1≤1, 0≤(x1+y1)≤1). The first-type semiconductor layer 520 may include an n-type dopant, for example, Si, Ge, Sn, or the like.

Figure 16:
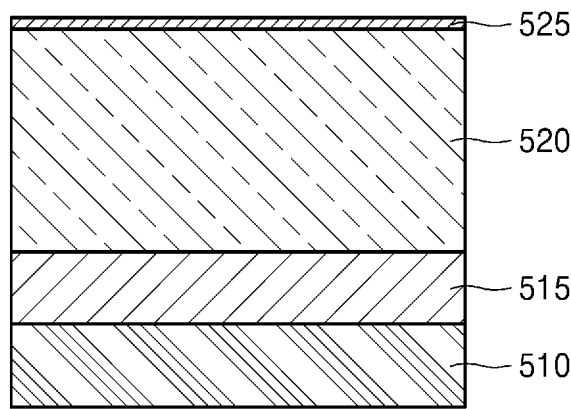

Referring to FIG. 16, a mask 525 may be provided on the first-type semiconductor layer 520. The mask 525 may include, for example, SiN. The mask 525 may be grown through an ex-situ process such as PECVD or LPCVD, or may be grown by an MOCVD in-situ process.

Figure 17:
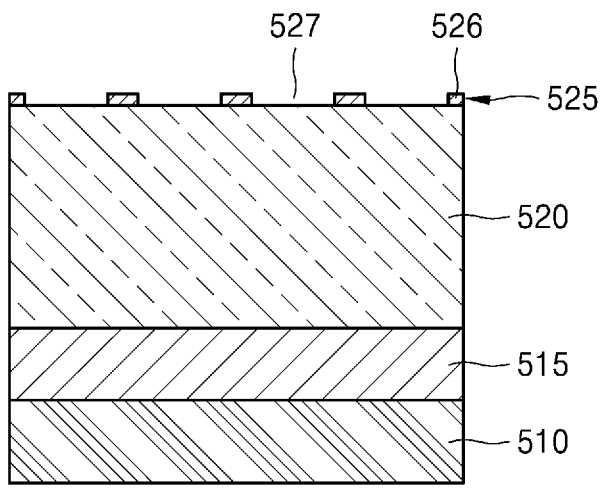

Referring to FIG. 17, a growth pattern structure may be formed by patterning the mask 525 through a photolithography process. The mask 525 may include an opening 527 and an insulating layer 526.

Figure 18:
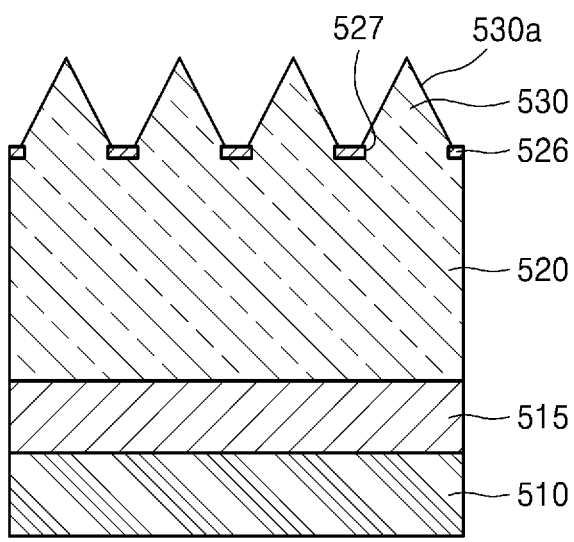
Figure 19:
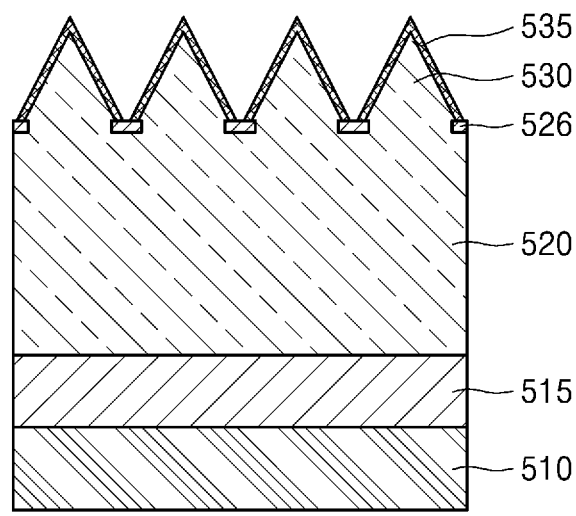

Referring to FIG. 18, a pyramidal structure 530 may be formed by growing a first-type semiconductor material on the first-type semiconductor layer 520 through the opening 527. The pyramidal structure 530 may include a semi-polar plane 530a such as {1-101}, {1-102}, etc. Referring to FIG. 19, a nitride light emitting layer 535 may be deposited on the pyramidal structure 530. The nitride light emitting layer 535 may be deposited to have a uniform thickness on the semi-polar plane 530a. The nitride light emitting layer 535 may be formed to contact the insulating layer 528. When the nitride light emitting layer 535 is grown on the semi-polar plane 530a, less piezoelectric field may be applied, compared to a case in which the nitride light emitting layer 535 is grown on a polar plane, so that a wavelength shift of output light due to an increase in current injection may be reduced. The effect of reducing the wavelength shift may appear more effectively when an In composition is increased to implement a long-wavelength light of green light or red light with InGaN, compared to blue light.

Figure 20:
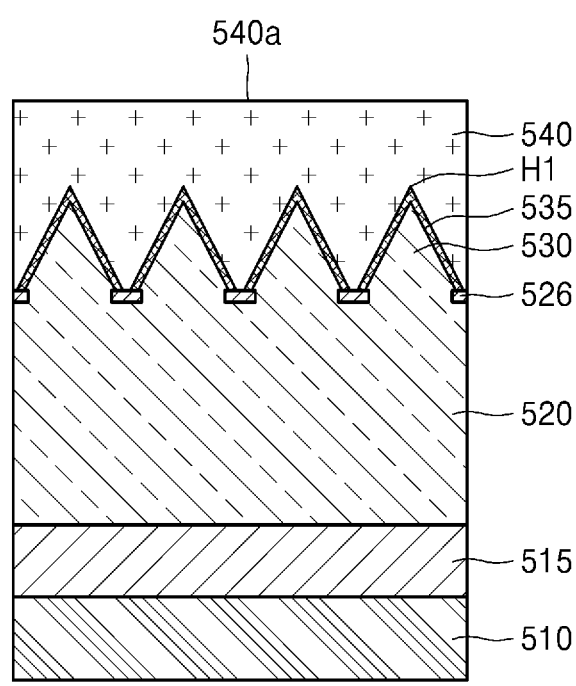

Referring to FIG. 20, a second-type semiconductor layer 540 may be deposited on the nitride light emitting layer 535. The nitride light emitting layer 535 may be formed as a single layer or as a multi-quantum well layer. The second-type semiconductor layer 540 may include $Al_{x1}In_{y1}Ga_{1-x1-y1}N$ (0≤x1≤1, 0≤y1≤1, 0≤(x1+y1)≤1). The second-type semiconductor layer 540 may include a p-type dopant, for example, Mg, B, or the like. The second-type semiconductor layer 540 may be formed to cover the nitride light emitting layer 535. The second-type semiconductor layer 540 may be grown to a position higher than a maximum height point H1 of the nitride light emitting layer 535. That is, the entire upper surface 540a of the second-type semiconductor layer 540 may be positioned higher than the maximum height point H1 of the nitride light emitting layer 535. The second-type semiconductor layer 540 may be grown so that an upper surface thereof is flat to improve processability.

Figure 21:
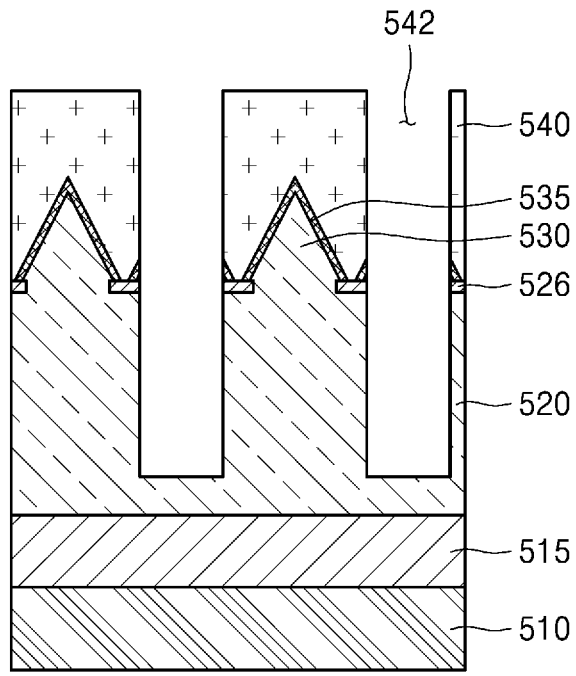

Referring to FIG. 21, the second-type semiconductor layer 540, the nitride light emitting layer 535, and the first-type semiconductor layer 520 may be etched to form a separation hole 542 extending from the second-type semiconductor layer 540 to a lower portion of the first-type semiconductor layer 520. The separation hole 542 may serve to separate a stacked structure shown in FIG. 20 into a plurality of nanorod LEDs A depth of the separation hole 542 may determine an overall thickness of the nanorod LED to be separated later. The separation hole 542 may be formed from the second-type semiconductor layer 540 to a predetermined depth of the first-type semiconductor layer 520. The separation hole 542 may be formed to a depth such that the buffer layer 515 is not exposed so that the buffer layer 515 does not adhere to the nanorod LED.

Figure 22:
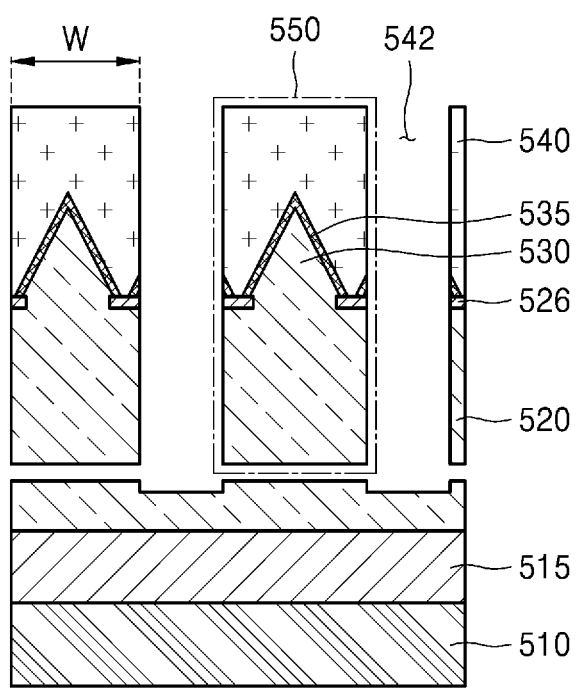

Referring to FIG. 22, a nanorod LED 550 may be formed by applying a force such as ultrasonic waves to the structure shown in FIG. 21 to remove the buffer layer 515 and the substrate 510 from the structure. A diameter W of the nanorod LED 550 may be determined by a position of the separation hole 542. Because the nanorod LED 550 is formed by etching, the nanorod LED 550 may be formed in a rod shape having the same diameter W in the overall structure. The number of pyramidal structures 530 provided in the nanorod LED 550 may be adjusted according to the position of the separation hole 542. Before separating the buffer layer 515 from the substrate 510, a protective layer (160 in FIG. 3), a first electrode (165 in FIG. 3), and a second electrode (167 in FIG. 3) may be formed on a side surface of the nanorod structure.

Figure 23:
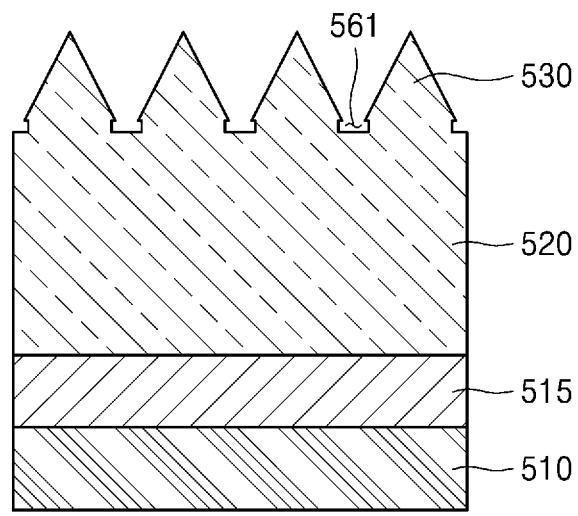
Figure 24:
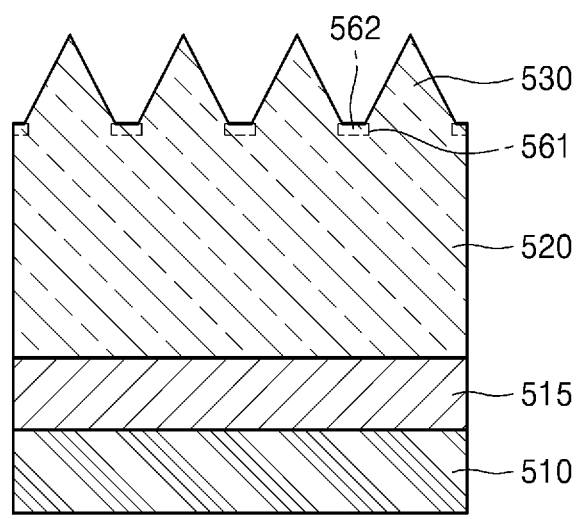

FIG. 23 illustrates another manufacturing method, in which the insulating layer 526 may be removed from the structure shown in FIG. 18. A recess 561 may be formed in a position in which the insulating layer 526 is removed. Referring to FIG. 24, the recess 561 may be filled with a first-type semiconductor material 562. In this manner, by removing the insulating layer 526, a poly-crystal type nitride growth that may occur when the nitride light emitting layer is grown on the mask may be reduced.

Figure 25:
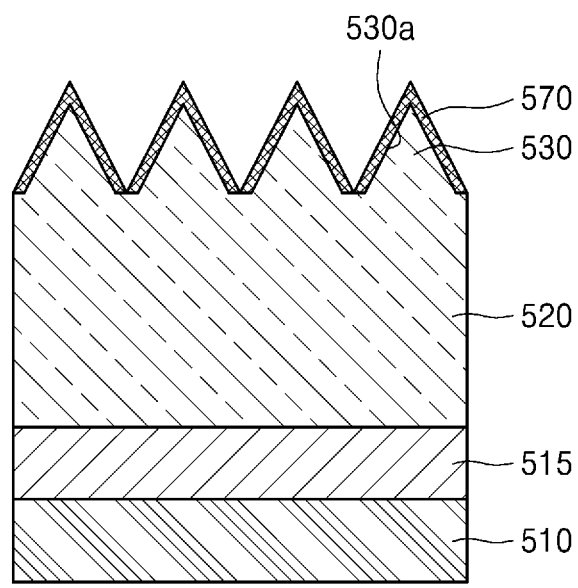

Referring to FIG. 25, in the structure shown in FIG. 24, a nitride light emitting layer 570 may be stacked on a semi-polar plane 530a of the pyramidal structure 530. In this case, the nitride light emitting layer 570 may be discontinuously isolated between the pyramidal structure 530 and the pyramidal structure 530, and the nitride light emitting layer 570 may not be provided in a region in which the pyramidal structure 530 and the pyramidal structure 530 meet.

Figure 26:
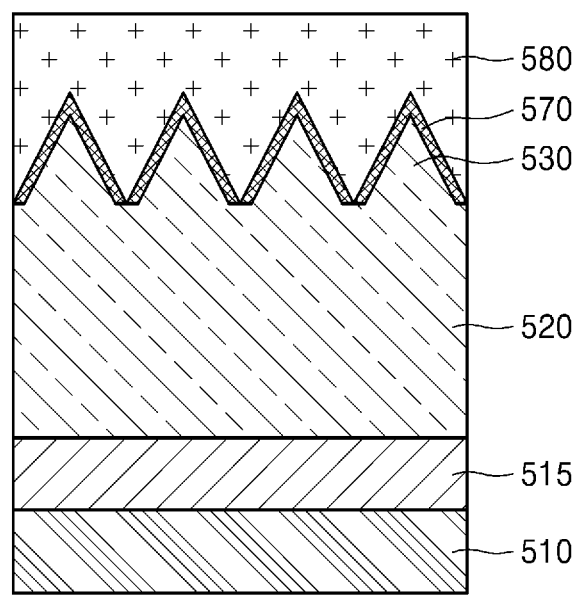

Referring to FIG. 26, a second-type semiconductor layer 580 may be formed on the nitride light emitting layer 570. For the structure shown in FIG. 26, a nanorod LED may be formed using the same manufacturing operations as those described above with reference to FIGS. 21 and 22.

As described above, in the manufacturing method according to the embodiment, a nanorod LED having a pyramidal structure may be easily manufactured through growth and etching processes.

The nanorod LED according to an example embodiment may emit highly efficient long-wavelength light, and may be applied to a display apparatus to provide a high-quality image. Nitride semiconductors may be used in various optoelectronic devices, and a utilization thereof has increased. A display apparatus according to an example embodiment may include at least one nanorod LED in one pixel to display a high-quality image. Regardless of shape or size of a display apparatus, most display apparatuses may implement a high resolution by reducing a pixel size. If all RGB colors for implementing a display apparatus are implemented with nanorod LEDs, colors may be implemented without a color filter.

Methods of manufacturing a nanorod LED include a selective growth method and an etching method. A nanorod manufactured using the selective growth method generally has a core-shell structure, and in this case, several planes such as a semi-polar plane and a non-polar plane are exposed, and here, a grown thickness and the degree of polarization are different depending on the planes, resulting in a non-uniform wavelength of light emitted from a quantum well and a large full width at half maximum (FWHM).

In addition, when the nanorods are manufactured through the etching process, leakage current may increase through a quantum well exposed on a side surface of the nanorod, thereby reducing luminous efficiency. In addition, when InGaN having a high In composition is grown on a plane such as the substrate, i.e., a c-plane to implement green or red wavelength, a blue-shift phenomenon in which a wavelength is shortened according to current injection due to a high piezoelectric field formed in an InGaN quantum well may occur.

In contrast, the nitride light emitting layer of the nanorod LED according to an example embodiment may be formed by selective growth, and the nanorod may be formed through an etching process. After growth to the first-type semiconductor layer, regions other than the selective growth region are blocked using a mask, and a pyramidal structure formed of the first-type semiconductor is formed through selective growth. The pyramidal structure exposes semi-polar planes such as {1-101}, {1-102}, etc. A nitride light emitting layer is grown on the semi-polar plane of the pyramidal structure, a second-type semiconductor layer may be stacked on the nitride light emitting layer, and then an etching process may be performed to form a nanorod structure having a semi-polar light emitting layer. In an example embodiment, because the nitride light emitting layer is formed only on the semi-polar plane of the pyramidal structure, the wavelength non-uniformity and large FWHM, which are problems in the existing growth method may be reduced and a problem due to the large piezoelectric field in the etching process of the related art may be reduced, thereby increasing the superposition of wave functions of electrons and holes to reduce a change in wavelength due to current injection. Accordingly, the display apparatus according to an example embodiment may display a high-resolution image and an image having excellent color reproducibility.

In addition, by configuring a plurality of pyramidal structures in the nanorod structure and reducing the size of the pyramidal structure to reduce a cross-sectional length of the semi-polar plane, the In composition and thickness uniformity of the nitride light emitting layer may be increased to improve wavelength dispersion.

Figure 27:
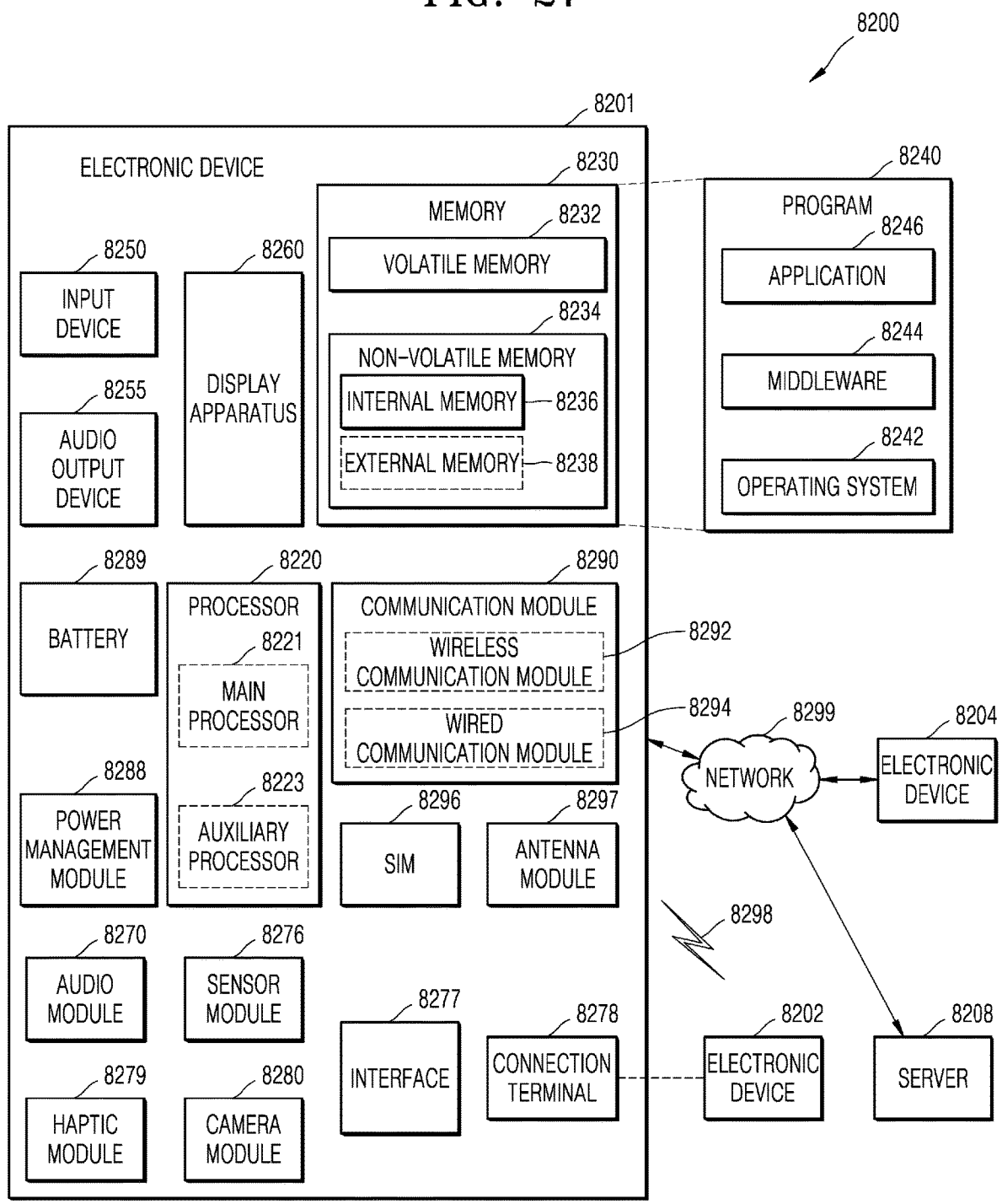
FIG. 27 is a schematic block diagram of an electronic device according to an example embodiment.

FIG. 27 is a block diagram of an electronic device 8201 including a display apparatus according to an example embodiment.

Referring to FIG. 27, the electronic device 8201 may be provided in a network environment 8200. In the network environment 8200, the electronic device 8201 may communicate with another electronic device 8202 through a first network 8298 (a short-range wireless communication network, etc.), or may communicate with another electronic device 8204 and/or a server 8208 through a second network 8299 (a long-range wireless communication network, etc.). The electronic device 8201 may communicate with the electronic device 8204 through the server 8208. The electronic device 8201 may include a processor 8220, a memory 8230, an input device 8250, an audio output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of these components of the electronic device 8201 may be omitted or other components may be added to the electronic device 8201. Some of these components may be implemented as one integrated circuit. For example, the sensor module 8276 (a fingerprint sensor, an iris sensor, an illuminance sensor, etc.) may be included in the display apparatus 8260 (display, etc.).

The processor 8220 may execute software (a program 8240, etc.) to control one or a plurality of other components (hardware, software components, etc.) among electronic devices 8201 connected to the processor 8220 and perform various data processing or operations. As part of the data processing or operations, the processor 8220 may load instructions and/or data received from other components (the sensor module 8276, the communication module 8290, etc.) into a volatile memory 8232, process instructions and/or data stored in the volatile memory 8232, and store result data in a nonvolatile memory 8234. The nonvolatile memory 8234 may include an internal memory 8236 and a detachable external memory 8238. The processor 8220 may include a main processor 8221 (a central processing unit, an application processor, etc.) and an auxiliary processor 8223 (a graphics processing unit, an image signal processor, a sensor hub processor, a communication processor, etc.) that may be operated independently or together with the main processor 8221. The auxiliary processor 8223 may use less power than the main processor 8221 and may perform specialized functions.

The auxiliary processor 8223 may control functions and/or states related to some (the display apparatus 8260, the sensor module 8276, the communication module 8290, etc.) of the components of the electronic device 8201 in place of the main processor 8221 while the main processor 8221 is inactive (a sleep state) or together with the main processor 8221 while the main processor 8221 is active (an application executed state). The auxiliary processor 8223 (an image signal processor, a communication processor, etc.) may be implemented as part of other functionally related components (the camera module 8280, the communication module 8290, etc.).

The memory 8230 may store various data required by the components (the processor 8220, the sensor module 8276, etc.) of the electronic device 8201. The data may include, for example, software (the program 8240, etc.) and input data and/or output data for commands related thereto. The memory 8230 may include the volatile memory 8232 and/or the nonvolatile memory 8234.

The program 8240 may be stored as software in the memory 8230 and may include an operating system 8242, middleware 8244, and/or an application 8246.

The input device 8250 may receive commands and/or data to be used by components (the processor 8220, etc. of the electronic device 8201) from the outside (a user, etc.) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as part of the speaker or may be implemented as an independent separate device.

The display apparatus 8260 may visually provide information to the outside of the electronic device 8201. The display apparatus 8260 may include a display, a hologram device, or a projector, and a control circuit for controlling a corresponding device. The display apparatus 8260 may include a display apparatus including the nanorod LED described above with reference to FIGS. 1 to 28. The display apparatus 8260 may include touch circuitry configured to detect a touch and/or a sensor circuit (a pressure sensor, etc.) configured to measure the strength of a force generated by the touch.

The audio module 8270 may convert sound into an electrical signal, or conversely, may convert an electrical signal into sound. The audio module 8270 may acquire sound through the input device 8250 and output sound through a speaker and/or a headphone of another electronic device (the electronic device 8202, etc.) connected to the audio output device 8255 and/or the electronic device 8201 directly or wirelessly.

The sensor module 8276 may detect an operating state (power, temperature, etc.) of the electronic device 8201 or an external environmental state (a user state, etc.), and generate an electrical signal and/or data value corresponding to the detected state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols that may be used for the electronic device 8201 to be connected to another electronic device (e.g., the electronic device 8202) directly or wirelessly. The interface 8277 may include a high definition multimedia interface (HDMI), a universal serial bus (USB) interface, an SD card interface, and/or an audio interface.

A connection terminal 8278 may include a connector through which the electronic device 8201 may be physically connected to another electronic device (such as the electronic device 8202). The connection terminal 8278 may include an HDMI connector, a USB connector, an SD card connector, and/or an audio connector (such as a headphone connector).

The haptic module 8279 may convert an electrical signal into a mechanical stimulus (vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and video. The camera module 8280 may include a lens assembly including one or more lenses, image sensors, image signal processors, and/or flashes. The lens assembly included in the camera module 8280 may collect light emitted from a subject to be imaged.

The power management module 8288 may manage power supplied to the electronic device 8201. The power management module 8288 may be implemented as part of a power management integrated circuit (PMIC).

The battery 8289 may supply power to components of the electronic device 8201. The battery 8289 may include a non-rechargeable primary cell, a rechargeable secondary cell, and/or a fuel cell.

The communication module 8290 may establish a direct (wired) communication channel and/or a wireless communication channel between the electronic device 8201 and other electronic devices (the electronic device 8202, the electronic device 8204, the server 8208, etc.) and support communication through the established communication channel. The communication module 8290 may include one or more communication processors operating independently of the processor 8220 (an application processor, etc.) and supporting direct communication and/or wireless communication. The communication module 8290 may include a wireless communication module 8292 (a cellular communication module, a short-range wireless communication module, a global navigation satellite system (GNSS) communication module, etc.) and/or a wired communication module 8294 (a local area network (LAN) communication module, a power line communication module, etc.). Among these communication modules, a corresponding communication module may communicate with another electronic device through the first network 8298 (a short-range communication network such as Bluetooth, WiFi Direct, or infrared Data Association (IrDA) or the second network 8299 (a telecommunication network such as a cellular network, the Internet, or a computer network (LAN), WAN, etc.). These various types of communication modules may be integrated into one component (a single chip, etc.) or may be implemented as a plurality of components (multiple chips) separate from each other. The wireless communication module 8292 may verify and authenticate the electronic device 8201 in the communication network such as the first network 8298 and/or the second network 8299 using subscriber information (an international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator including a conductive pattern formed on a board (a printed circuit board (PCB), etc.). The antenna module 8297 may include one or a plurality of antennas. When a plurality of antennas are included, an antenna suitable for a communication method used in a communication network such as the first network 8298 and/or the second network 8299 may be selected from among the plurality of antennas by the communication module 8290. Signals and/or power may be transmitted or received between the communication module 8290 and other electronic devices through the selected antenna. A component (an RFIC, etc.) other than the antenna may be included as part of the antenna module 8297.

Some of the components may be connected to each other through communication methods (a bus, a general purpose input and output (BPIO), a serial peripheral interface (SPI), a mobile industry processor interface (MIPI)) and exchange signals (commands, data, etc.) with each other.

The command or data may be transmitted or received between the electronic device 8201 and the electronic device 8204 through the server 8208 connected to the second network 8299. The other electronic devices 8202 and 8204 may be the same or different types of devices as the electronic device 8201. All or some of the operations executed by the electronic device 8201 may be executed by one or more of the other electronic devices 8202, 8204, and 8208. For example, when the electronic device 8201 needs to perform a function or service, the electronic device 8201 may request one or more other electronic devices to perform a portion or the entirety of the function or the service, instead of executing the function or service by itself. Upon receiving the request, one or more other electronic devices may execute an additional function or service related to the request, and transmit a result of the execution to the electronic device 8201. To this end, cloud computing, distributed computing, and/or client-server computing technology may be used.

Figure 28:
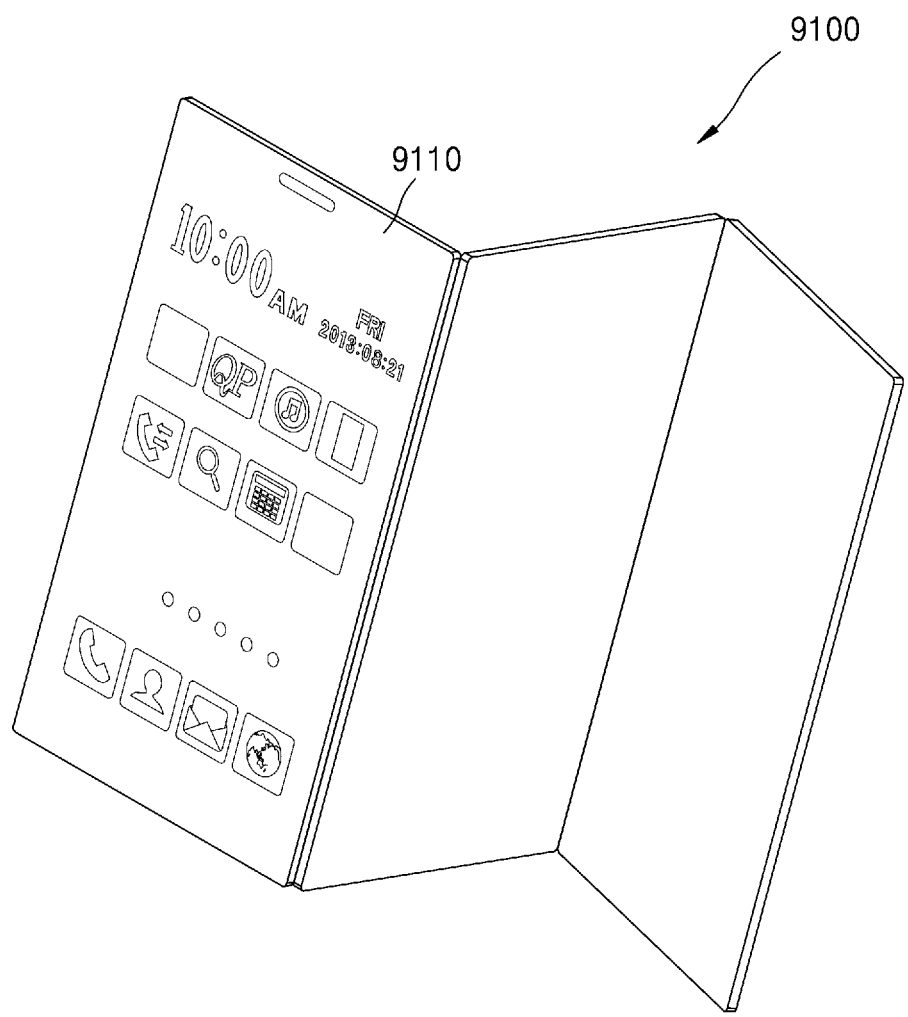
FIG. 28 illustrates an example in which a display apparatus according to an example embodiment is applied to a mobile device.

FIG. 28 illustrates an example in which an electronic device is applied to a mobile device 9100 according to an example embodiment. The mobile device 9100 may include a display apparatus 9110, and the display apparatus 9110 may have a foldable structure, for example, a multi-foldable structure.

Figure 29:
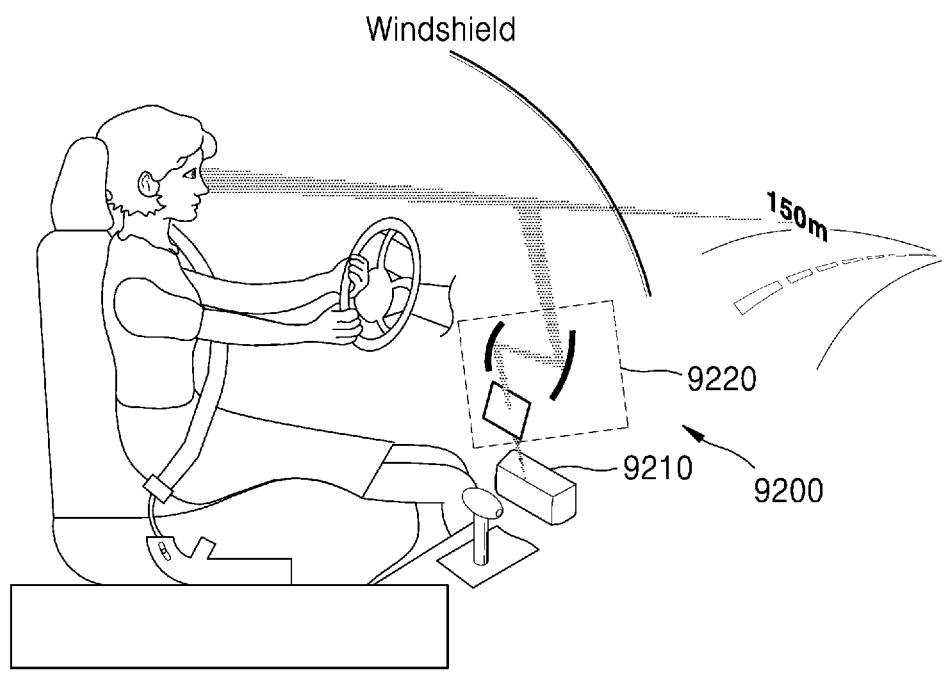
FIG. 29 illustrates an example in which a display apparatus according to an example embodiment is applied to a vehicle display apparatus.

FIG. 29 illustrates an example in which a display apparatus according to an example embodiment is applied to a vehicle. The display apparatus may be a head-up display apparatus 9200 for a vehicle and may include a display 9210 provided in a region of a vehicle and a light path changing member 9220 for changing a path of light so that a driver may see an image generated by the display 9210.

Figure 30:
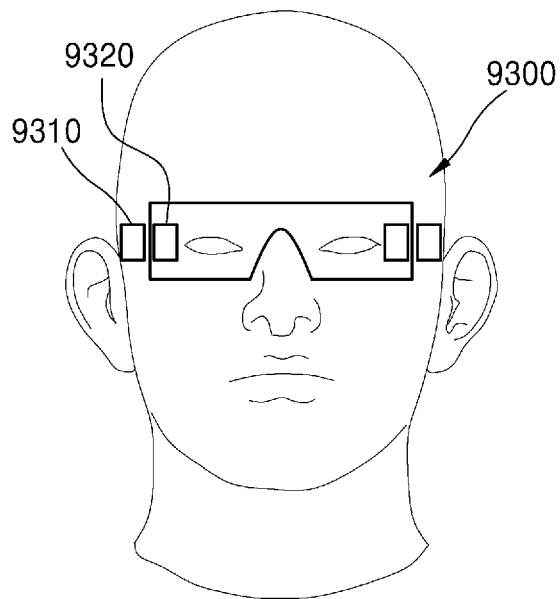
FIG. 30 illustrates an example in which a display apparatus according to an example embodiment is applied to augmented reality glasses.

FIG. 30 illustrates an example in which a display apparatus according to an example embodiment is applied to augmented reality (AR) glasses or virtual reality (VR) glasses. The AR glasses 9300 may include a projection system 9310 forming an image and an element 9320 guiding the image from the projection system 9310 to a user's eye.

Figure 31:
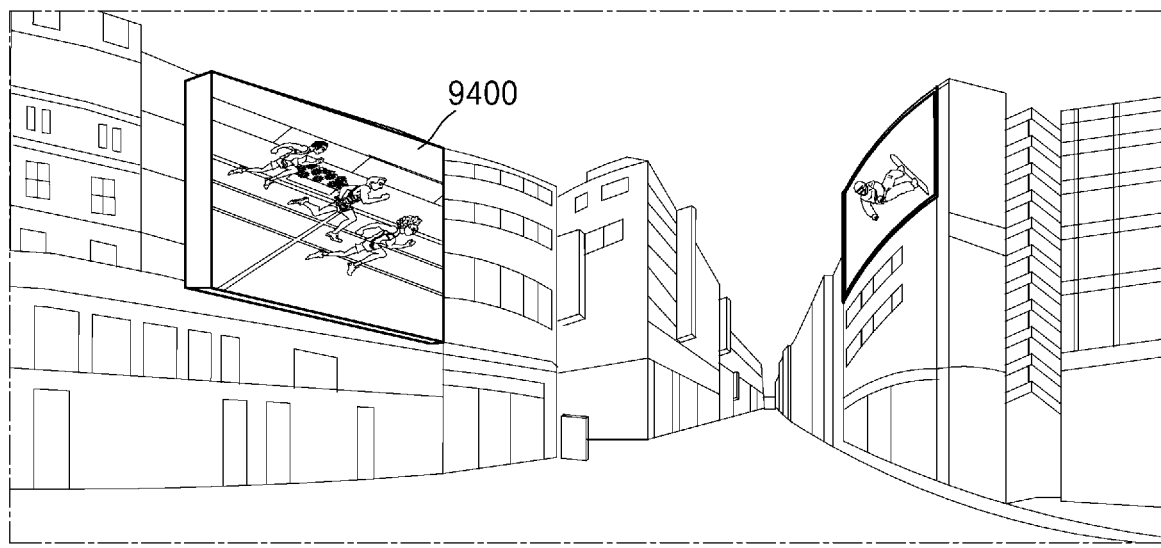
FIG. 31 illustrates an example in which a display apparatus according to an example embodiment is applied to a signage.

FIG. 31 illustrates an example in which a display apparatus according to an example embodiment is applied to a large-sized signage. The signage 9400 may be used for outdoor advertisements using a digital information display and may control advertisement content and the like through a communication network. The signage 9400 may be implemented, for example, through the electronic device described above with reference to FIG. 27.

Figure 32:
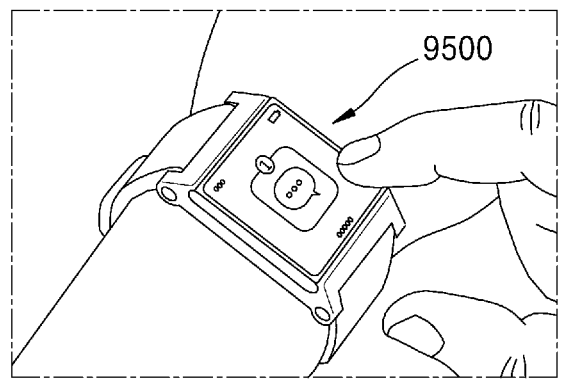
FIG. 32 illustrates an example in which a display apparatus according to an example embodiment is applied to a wearable display.

FIG. 32 illustrates an example in which a display apparatus according to an example embodiment is applied to a wearable display 9500. The wearable display 9500 may include a display apparatus including a nanorod LED according to an example embodiment, and may be implemented through the electronic device described above with reference to FIG. 27.

The display apparatus according to an example embodiment may be applied to various products such as a rollable TV, a stretchable display, etc.

The embodiments described above are merely examples, and various modifications and equivalent other embodiments may be made by those skilled in the art. Therefore, a true technical protection scope according to the embodiment should be determined by the technical idea described in the claims below.

The nanorod LED according to an example embodiment may include a light emitting layer having a pyramidal structure to reduce a change in wavelength due to an increase in current. The display apparatus according to an example embodiment may include a nanorod LED to realize high resolution and increase color reproducibility.

The method for manufacturing a nanorod LED according to an example embodiment may easily manufacture a nanorod LED including a light emitting layer having a pyramidal structure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A nanorod light emitting diode (LED) comprising:
a first-type semiconductor layer including a body and a pyramidal structure continuously provided from the body;
a nitride light emitting layer provided on the pyramidal structure; and
a second-type semiconductor layer provided on the nitride light emitting layer,
wherein the first-type semiconductor layer, the nitride light emitting layer, and the second-type semiconductor layer are stacked to form a nanorod,
wherein the nanorod has a diameter in a direction, in which, the first-type semiconductor layer, the nitride light emitting layer, and the second-type semiconductor layer are stacked, and
wherein a diameter of the first-type semiconductor layer and a diameter of the second-type semiconductor layer are same as the diameter of the nanorod.

2. The nanorod LED of claim 1, wherein the diameter ranges from about 0.1 µm to about 1 µm.

3. The nanorod LED of claim 1, wherein a thickness of the nanorod is greater than the diameter.

4. The nanorod LED of claim 1, wherein a maximum thickness of the second-type semiconductor layer is in a range between 20 nm to 2 µm.

5. The nanorod LED of claim 1, wherein the first-type semiconductor layer and the second-type semiconductor layer include $Al_{x1}In_{y1}Ga_{1-x1-y1}N$ ($0 \leq x1 \leq 1$, $0 \leq y1 \leq 1$, $0 \leq (x1+y1) \leq 1$).

6. The nanorod LED of claim 1, wherein the nitride light emitting layer includes $Al_{x2}In_{y2}Ga_{1-x2-y2}N$ ($0.1 \leq (x2+y2) \leq 1$, $0.1 < y2 < 0.6$).

7. The nanorod LED of claim 1, wherein the first-type semiconductor layer includes a dopant including Si, Ge, and Sn.

8. The nanorod LED of claim 1, wherein the second-type semiconductor layer includes Mg and B.

9. The nanorod LED of claim 1, wherein the pyramidal structure includes a hexagonal pyramidal structure or a truncated hexagonal pyramidal structure.

10. The nanorod LED of claim 1, wherein an entire upper surface of the second-type semiconductor layer is positioned to be higher than a maximum height of the nitride light emitting layer.

11. The nanorod LED of claim 10, wherein an upper surface of the second-type semiconductor layer is configured to have a planar or concave-convex structure.

12. The nanorod LED of claim 1, wherein the nanorod is configured to have a circular cross-section or a hexagonal cross-section.

13. The nanorod LED of claim 1, wherein the pyramidal structure is provided in plurality.

14. The nanorod LED of claim 1, wherein the nanorod LED further includes an insulating layer directly between a portion of the nitride light emitting layer and a portion of the body of the first-type semiconductor layer.

15. The nanorod LED of claim 1, further comprising a protective layer on a side surface of the nanorod.

16. A display apparatus comprising:
a substrate;
a common electrode provided on a first side of an upper surface of the substrate;
a plurality of pixel electrodes provided to face the common electrode and spaced apart from each other; and
a nanorod light emitting diode (LED) connected between the common electrode and the plurality of pixel electrodes,
wherein the nanorod LED includes:
a first-type semiconductor layer including a body and a pyramidal structure continuously provided from the body;
a nitride light emitting layer provided in the pyramidal structure; and
a second-type semiconductor layer provided on the nitride light emitting layer,
wherein the first-type semiconductor layer, the nitride light emitting layer, and the second-type semiconductor layer are stacked to form a nanorod,
wherein the nanorod has a diameter in a direction, in which, the first-type semiconductor layer, the nitride light emitting layer, and the second-type semiconductor layer are stacked, and
wherein a diameter of the first-type semiconductor layer and a diameter of the second-type semiconductor layer are same as the diameter of the nanorod.

17. The display apparatus of claim 16, wherein the diameter ranges from about 0.1 µm to about 1 µm.

18. The display apparatus of claim 16, wherein a thickness of the nanorod is greater than the diameter.

19. The display apparatus of claim 16, wherein a maximum thickness of the second-type semiconductor layer is in a range between 20 nm to 2 µm.

20. The display apparatus of claim 16, wherein the first-type semiconductor layer and the second-type semiconductor layer include $Al_{x1}In_{y1}Ga_{1-x1-y1}N$ ($0 \leq x1 \leq 1$, $0 \leq y1 \leq 1$, $0 \leq (x1+y1) \leq 1$).

21. The display apparatus of claim 16, wherein the nitride light emitting layer includes $Al_{x2}In_{y2}Ga_{1-x2-y2}N$ ($0.1 \leq (x2+y2) \leq 1$, $0.1 < y2 < 0.6$).

22. The display apparatus of claim 16, wherein the stacking direction of the nanorod LED is parallel to the substrate.

23. The display apparatus of claim 16, wherein an entire upper surface of the second-type semiconductor layer is positioned to be higher than a point of a maximum height of the nitride light emitting layer.

24. The display apparatus of claim 23, wherein an upper surface of the second-type semiconductor layer is configured to have a planar or concave-convex structure.

25. The display apparatus of claim 16, wherein the nanorod is configured to have a circular cross-section or a hexagonal cross-section.

26. The display apparatus of claim 16, wherein the pyramidal structure is provided in plurality.

27. The display apparatus of claim 16, further comprising an insulating layer directly between a portion of the nitride light emitting layer and a portion of the body of the first-type semiconductor layer.

28. The display apparatus of claim 16, further comprising a protective layer on a side surface of the nanorod.

29. A nanorod comprising:
a first-type semiconductor layer including a body portion and a top portion provided on the body portion, the top portion having a structure configured to expose one or more semi-polar planes;
a nitride light emitting layer provided on the top portion of the first-type semiconductor layer; and
a second-type semiconductor layer provided on the nitride light emitting layer,
wherein a diameter of the first-type semiconductor layer and a diameter of the second-type semiconductor layer are same as a diameter of the nanorod.

30. The nanorod of claim 29, wherein the first-type semiconductor layer, the nitride light emitting layer, and the second-type semiconductor layer are stacked to form the nanorod, and
wherein the nanorod has a same diameter in a direction, in which, the first-type semiconductor layer, the nitride light emitting layer, and the second-type semiconductor layer are stacked.

* * * * *